(12) United States Patent
Taya et al.

(10) Patent No.: US 7,280,016 B2
(45) Date of Patent: Oct. 9, 2007

(54) DESIGN OF MEMBRANE ACTUATOR BASED ON FERROMAGNETIC SHAPE MEMORY ALLOY COMPOSITE FOR SYNTHETIC JET ACTUATOR

(75) Inventors: Minoru Taya, Mercer Island, WA (US); Robert Yuanchang Liang, Seattle, WA (US); Yasuo Kuga, Seattle, WA (US)

(73) Assignee: University of Washington, Seattle, WA (US)

( * ) Notice: Subject to any disclaimer, the term of this patent is extended or adjusted under 35 U.S.C. 154(b) by 36 days.

(21) Appl. No.: 11/070,385

(22) Filed: Mar. 1, 2005

(65) Prior Publication Data

US 2007/0205853 A1    Sep. 6, 2007

Related U.S. Application Data

(63) Continuation-in-part of application No. 10/790,634, filed on Feb. 27, 2004, now Pat. No. 7,104,056.

(60) Provisional application No. 60/548,968, filed on Mar. 1, 2004, provisional application No. 60/450,632, filed on Feb. 27, 2003, provisional application No. 60/450,633, filed on Feb. 27, 2003.

(51) Int. Cl.
*H01H 51/22* (2006.01)

(52) U.S. Cl. .......................... 335/78; 200/181

(58) Field of Classification Search .................. 335/78; 200/181

See application file for complete search history.

(56) References Cited

U.S. PATENT DOCUMENTS 2,494,235 A    1/1950    Gierwiatowski ............. 250/40

(Continued)

FOREIGN PATENT DOCUMENTS

JP    62088890 A    4/1987

(Continued)

OTHER PUBLICATIONS

Matsunaga, Yasuhiro et al. "Design of ferromagnetic shape memory alloy composites based on TiNi for robust and fact actuators." 2002. *Proc. SPIE on Smart Materials.* Mar. 17-21, 2002: 4699:172. 10pp.

(Continued)

*Primary Examiner*—Elvin Enad
*Assistant Examiner*—Bernard Rojas
(74) *Attorney, Agent, or Firm*—Ronald M. Anderson

(57) ABSTRACT

A membrane actuator includes a magnetically actuatable membrane and a magnetic trigger. The membrane includes a shape memory alloy (SMA), and the magnetic trigger is configured to induce a martensitic transformation in the SMA, to produce a larger force than would be achievable with non-SMA-based materials. Such a membrane actuator can be beneficially incorporated into a wide variety of devices, including fluid pumps, shock absorbing systems, and synthetic jet producing devices for use in an aircraft. The membrane/diaphragm can be formed from a ferromagnetic SMA, or a ferromagnetic material can be coupled with an SMA such that the SMA and the ferromagnetic material move together. A hybrid magnetic trigger, including a permanent magnet and an electromagnet, is preferably used for the magnetic trigger, as hybrid magnetic triggers are easy to control, and produce larger magnetic gradients than permanent magnets or electromagnets alone.

20 Claims, 18 Drawing Sheets

U.S. PATENT DOCUMENTS

| | | | | |
|---|---|---|---|---|
| 3,096,449 | A | 7/1963 | Stucki | 307/88.5 |
| 3,517,193 | A | 6/1970 | Mook, Jr. et al. | 250/83.1 |
| 3,942,759 | A | 3/1976 | Passera et al. | 251/129 |
| 5,071,064 | A | 12/1991 | AbuJudom et al. | 236/1 G |
| 5,475,353 | A * | 12/1995 | Roshen et al. | 335/78 |
| 6,427,712 | B1 | 8/2002 | Ashurst | 60/527 |
| 6,457,654 | B1 | 10/2002 | Glezer et al. | 239/4 |
| 6,499,952 | B1 | 12/2002 | Jacot et al. | 60/527 |
| 6,563,933 | B1 | 5/2003 | Niederdraenk | 381/417 |
| 6,609,698 | B1 | 8/2003 | Parsons et al. | 251/129.17 |
| 6,633,095 | B1 | 10/2003 | Swope et al. | 310/12 |
| 6,796,124 | B2 | 9/2004 | Kutlucinar | 60/528 |
| 6,832,477 | B2 | 12/2004 | Gummin et al. | 60/527 |
| 2003/0202048 | A1* | 10/2003 | Silverbrook | 347/54 |
| 2003/0206490 | A1* | 11/2003 | Butler et al. | 367/163 |
| 2005/0263359 | A1* | 12/2005 | Mankame et al. | 188/266.1 |
| 2006/0186706 | A1* | 8/2006 | Browne et al. | 296/203.01 |

FOREIGN PATENT DOCUMENTS

| | | |
|---|---|---|
| JP | 2002129273 A | 5/2002 |
| JP | 2002285269 A * | 10/2002 |

OTHER PUBLICATIONS

Wada, Taishi and Taya, Minoru. "Spring-based actuators." *Smart Structures and Materials 2002*: Active Materials: Behavior and Mechanics, Christopher S. Lynch, Editor, Proceedings of SPIE vol. 4699 (2002). pp. 294-302.

Liang, Yuanchang; Taya, M.; Kuga, Yasuo. "Design of membrane actuators based on ferromagnetic shape memory allow composite for the synthetic jet actuator." *Smart Structures and Materials 2004*. Proc. of SPIE vol. 5390 pp. 268-275.

Wu, Kevin E., and Breur, Kenneth S. "Dynamics of Synthetic Jet Actuator Arrays For Flow Control." *American Institute of Aeronautics and Astronautics*. © 2003. 8pp. Available at: <http://microfluids.engin.brown.edu/Breuer%20Group%20Papers.html>.

Liang, Yuanchange; Taya, M.; Kuga, Yasuo. "Design of diaphram actuator based on ferromagnetic shape memory alloy composite." *Smart Structures and Materials 2003*. Proc. of SPIE vol. 5054 pp. 45-52.

Gorman, Jessica. "Fracture Protection: Nanotubes toughen up ceramics." *Science News Online*. Week of Jan. 4, 2003: vol. 163, No. 1, p. 3.

Lagoudas, Dimitris. "Dynamic Behavior and Shock Absorption Properties of Porous Shape Memory Alloys." *Storming Media*. A577304: Jul. 8, 2002. 3pp.

Lagoudas, Dimitris. "Pseudoelastic SMA Spring Elements for Passive Vibration Isolation: Part I—Modeling." *Storming Media*. A639824: Jun. 2004. 3pp.

Lagoudas, Dimitris C., and Eric L. Vandygriff. "Processing and Characterization of NiTi Porous SMA by Elevated Pressure Sintering." *Center for Mechanics and Composites*. Aerospace Engineering Department, Texas A&M University, 22pp.

Liang, Yuanchang; Taya, M.; Kuga, Yasuo. "Design of membrane actuators based on ferromagnetic shape memory allow composite for the synthetic jet actuator." *Smart Structures and Materials 2004*. Proc. of SPIE vol. 5390 pp. 268-275.

Ye, L.L., Liu, Z.G., Raviprasad, K., Quan, M.X., Umemoto, M., and Hu, Z.Q.. "Consolidation of MA amorphous NiTi powders by spark plasma sintering," *Materials Science and Engineering A241 (1998)*. pp. 290-293.

"Fine Particle Industry Review, 1998." *Business Communications Co.*. May 1999: 5pp.

Suorsa, Ilkka. "Performance and Modeling of Magnetic Shape Memory Actuators and Sensors." 3pp. <http://lib.tkk.fi/Diss/2005/isbn9512276453/>.

Suorsa Ilkka. "Performance and Modeling of Magnetic Shape Memory Actuators and Sensors." *Department of Electrical and Communications Engineering Laboratory of Electromechanics*. Helsinki University of Technology, 70pp.

* cited by examiner

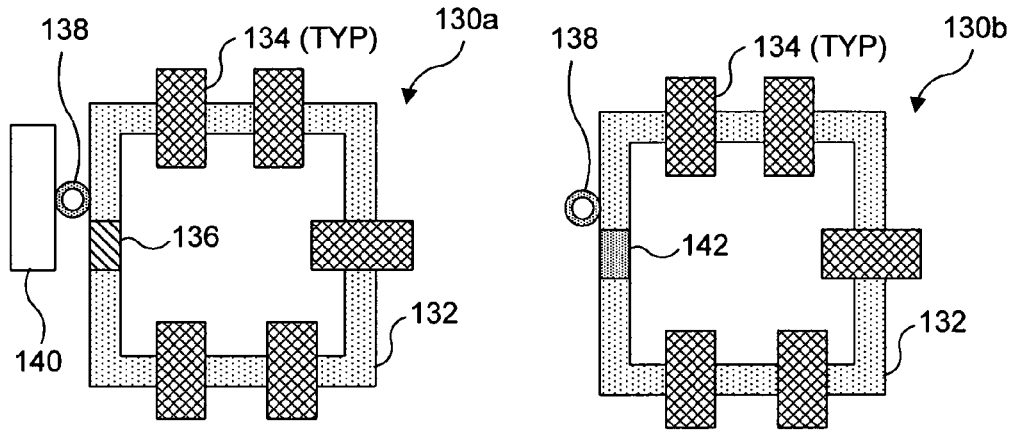
*FIG. 14A*   *FIG. 14B*
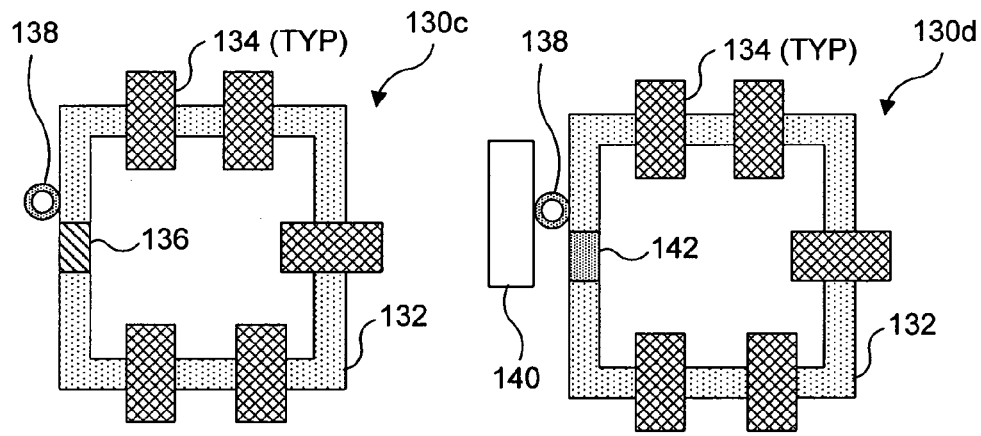
*FIG. 14C*   *FIG. 14D*
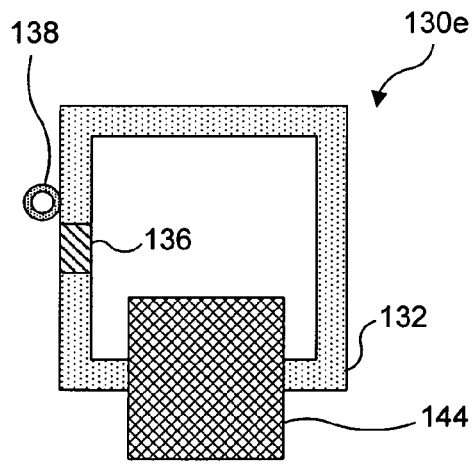
*FIG. 14E*

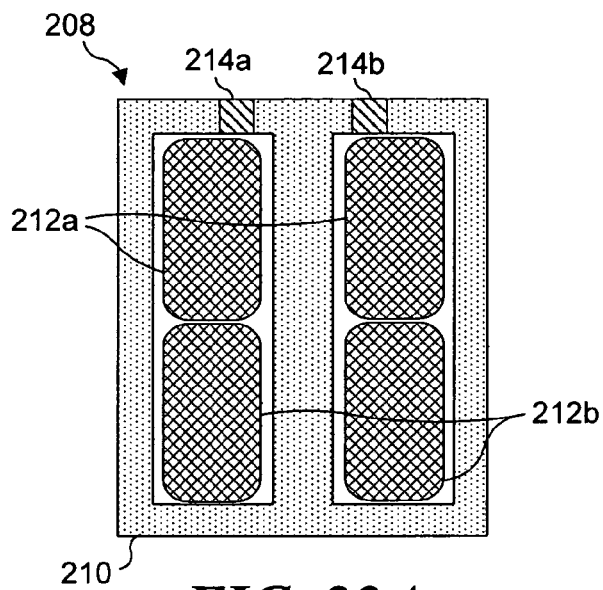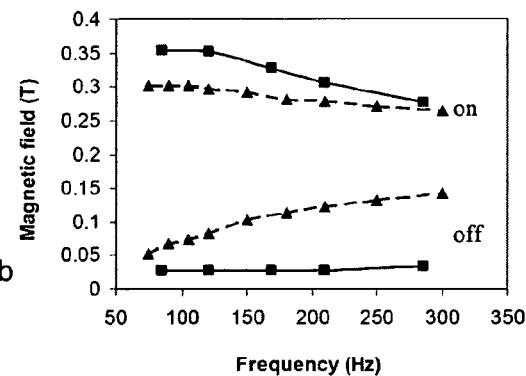
*FIG. 22A*  *FIG. 22D*
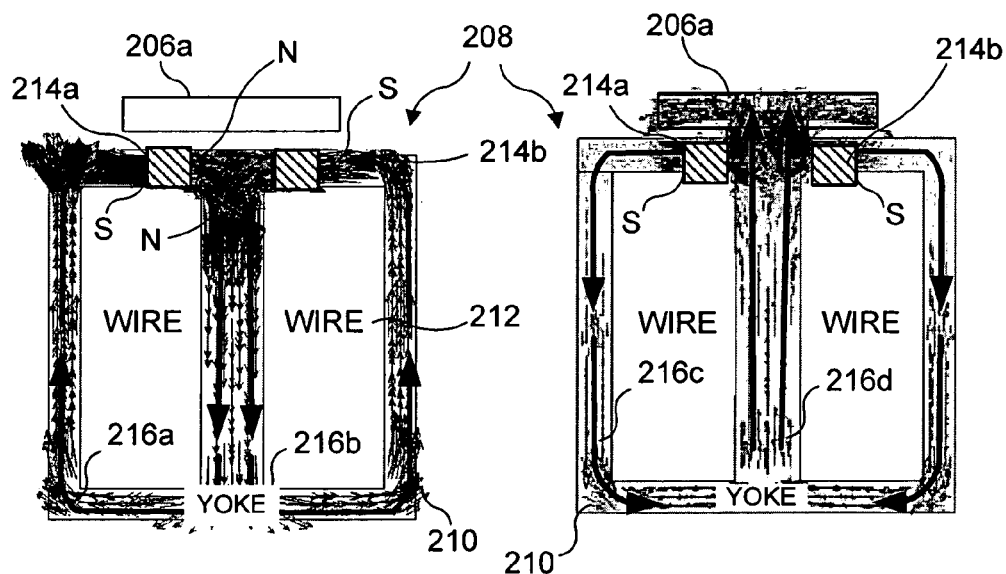
*FIG. 22B*  *FIG. 22C*

DESIGN OF MEMBRANE ACTUATOR BASED ON FERROMAGNETIC SHAPE MEMORY ALLOY COMPOSITE FOR SYNTHETIC JET ACTUATOR

RELATED APPLICATIONS

This application is based on a prior copending provisional application Ser. No. 60/548,968, filed on Mar. 1, 2004, the benefit of the filing date of which is hereby claimed under 35 U.S.C. § 119(e). This application is also a continuation-in-part of a copending patent application Ser. No. 10/790,634, filed on Feb. 27, 2004 now U.S. Pat. No. 7,104,056, which itself is based on two prior copending provisional applications, No. 60/450,632, filed on Feb. 27, 2003, and Ser. No. 60/450,633, filed on Feb. 27, 2003, the benefits of the filing dates of which are hereby claimed under 35 U.S.C. § 119(e) and 120.

GOVERNMENT RIGHTS

This invention was funded at least in part with DARPA Grant No. N00014-02-1-0689, and the U.S. government may have certain rights in this invention.

FIELD OF THE INVENTION

The present invention generally relates to the use of ferromagnetic shape memory alloys (FSMAs), and more specifically, relates to the use of FSMAs in synthetic jet actuators.

BACKGROUND OF THE INVENTION

Actuators are relatively simple mechanical components that are often incorporated into more complex mechanical systems, including those found in automobiles, aircraft, manufacturing facilities, and processing facilities. A conventional solenoid is one example of an actuator that has found broad application across many types of industries and technologies.

Shape memory alloys (SMAs) are metals that exist in two distinct solid phases, referred to as Martensite and Austenite. Martensite is relatively soft and easily deformed, whereas Austenite is relatively stronger and less easily deformed. SMAs can be induced to change phase by changes in temperature and changes in mechanical stress. Also, SMAs can generate relatively large forces (when resistance is encountered during their phase transformation) and can exhibit relatively large movements as they recover from large strains. SMAs have been used commercially in many types of actuators, where a temperature change is used to initiate and control the actuation cycle. One of the most widely recognizable applications has been the use of SMA-based actuators in automatic sprinkler systems.

One disadvantage of SMA actuators triggered by changes in temperature is that a heating or cooling device must be incorporated into the actuator, increasing the size, expense, and complexity of the actuator. Further, the response of such an actuator depends on heat transfer, which can occur too slowly for certain applications. Material scientists have more recently recognized that the phase change between Martensite and Austenite can be induced by changes in an applied magnetic field in certain alloys, as well as by changes in temperature and stress loading. Because magnetic fields generated with electromagnets can be rapidly switched on and off, particularly compared to the time required to induce a change in temperature to initiate an actuation, electromagnetically controlled SMA-based actuators appear to offer promise in applications where rapidly responding actuation is required. Such alloys are referred to as FSMAs.

A particularly useful type of actuator is a membrane or diaphragm actuator. In such an actuator, deflection of a membrane or diaphragm is selectively controllable to carryout a desired function. Membrane actuators are useful in hydraulic systems and in hydraulic pumps. It would be desirable to provide improved membrane actuators.

It has been shown that active flow control technology can add external energy into a flow field that helps aircraft improve aerodynamic performance, by reducing jet noise and improving aerodynamic stall characteristics. Such active flow control can be achieved by injecting synthetic jets with high momentum air into the flow at appropriate locations on aircraft wings. For example, the Boeing Company has applied active flow control technology to rotorcraft. Currently, most synthetic jet actuators have been constructed based on piezoelectric actuator materials. However, piezoelectric materials generally do not produce forces sufficiently strong to induce strong jet flow. It would thus be desirable to provide membrane actuators capable of achieving powerful synthetic jets.

The prior art does not teach or suggest magnetically controlled SMA-based membrane actuators, or using such magnetically controlled SMA-based membrane actuators to achieve a synthetic jet.

SUMMARY OF THE INVENTION

The present invention is directed to a membrane actuator (also referred to as a diaphragm actuator) in which movement of the membrane/diaphragm is controlled by a magnetic trigger. Such a membrane actuator can be beneficially incorporated into a wide variety of devices, including fluid pumps, shock absorbing systems, and synthetic jet producing devices for use in an aircraft. Significantly, the membrane/diaphragm utilized in the present invention is formed of an SMA. The membrane/diaphragm can be formed from an FSMA, or a ferromagnetic material can be coupled with an SMA such that the SMA and the ferromagnetic material move together. Preferably, the magnetic trigger is configured to induce a stress-induced martensitic transformation in the SMA, to produce a larger force than would be achievable with non-SMA-based materials.

A particularly useful membrane/diaphragm can be formed by attaching ferromagnetic soft iron to a super elastic grade of NiTi shape memory alloy. Preferably, a hybrid magnetic trigger is used, including at least one permanent magnet and at least one electromagnet. The electromagnet portion of the hybrid magnetic trigger enables fast response to be achieved. Such hybrid magnetic triggers, which combine permanent magnets and electromagnets, enable larger deformations of the membrane/diaphragm to be achieved, as compared with electromagnets alone. Permanent magnets alone are less desirable as magnetic triggers, because they cannot be turned on and off as electromagnets can be. If a permanent magnet alone is used as a magnetic trigger, then additional elements must be included to vary the magnetic flux between the permanent magnet and the membrane/diaphragm. For example, a prime mover that would move the permanent magnet relative to the membrane/diaphragm could be employed, but that would significantly increase the size, cost, and complexity of the device as compared with devices implementing the more preferred hybrid magnetic trigger.

The present invention further encompasses a method for moving a fluid. In such a method, a membrane/diaphragm comprises at least one of a ferromagnetic material coupled with a SMA and an FSMA. The membrane/diaphragm is placed in fluid communication with the fluid. The magnetic trigger actuates the membrane/diaphragm, such that the actuated the membrane/diaphragm moves from a first position to a second position. Movement of the membrane/diaphragm causes a corresponding movement in the fluid. Preferably, the magnetic trigger employed is sufficiently powerful to induce a martensitic transformation in the SMA. Cyclical actuation of the membrane/diaphragm can be used to pump a fluid or generate a synthetic jet.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein:

FIG. 1A schematically illustrates a diaphragm actuator in accord with the present invention, including a magnetically actuatable SMA diaphragm and a magnetic trigger;

FIG. 1B schematically illustrates the diaphragm actuator of FIG. 1A and shows the diaphragm being displaced by the magnetic trigger;

FIG. 2 schematically illustrates another embodiment of an SMA diaphragm actuator, in which the SMA diaphragm is implemented by attaching ferromagnetic material to a relatively thin SMA sheet, and wherein the magnetic trigger is a hybrid magnetic trigger including both an electromagnet and a permanent magnet;

FIG. 3 graphically illustrates a force and strain relationship for NiTi, a particularly preferred SMA for use in a diaphragm actuator in accord with the present invention;

FIG. 4A schematically illustrates an SMA diaphragm actuator in accord with the present invention, where the SMA diaphragm actuator is configured to pump a fluid;

FIG. 4B schematically illustrates actuation of the SMA diaphragm actuator of FIG. 4A, resulting in a discharge of fluid;

FIG. 4C schematically illustrates SMA diaphragm actuators configured to produce a synthetic jet that is incorporated into an aircraft wing;

FIG. 4D schematically illustrates SMA diaphragm actuators in accord with the present invention and incorporated into the suspension system of a vehicle, for dampening the suspension system;

FIG. 5A schematically illustrates an SMA diaphragm actuator including a single magnetically actuatable SMA diaphragm and a pair of hybrid magnetic triggers;

FIG. 5B schematically illustrates an SMA diaphragm actuator including a pair of magnetically actuatable SMA diaphragms and a single hybrid magnetic trigger;

FIG. 6A schematically illustrates a cross-sectional configuration of an exemplary hybrid magnetic trigger for use in the SMA diaphragm actuator of FIG. 5B;

Figure 5A:
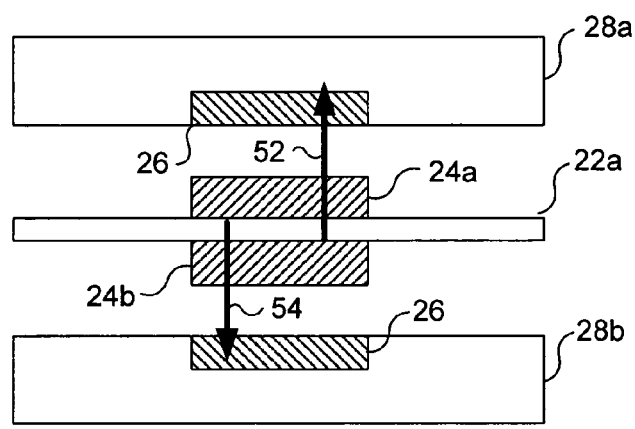
Figure 5B:
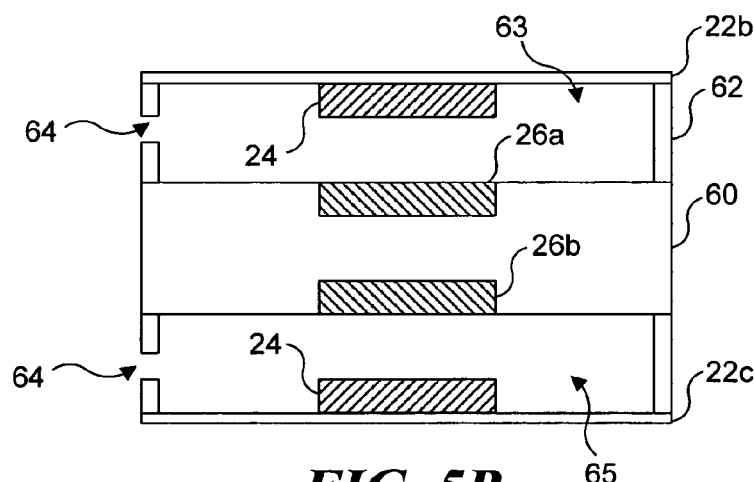
Figure 7A:
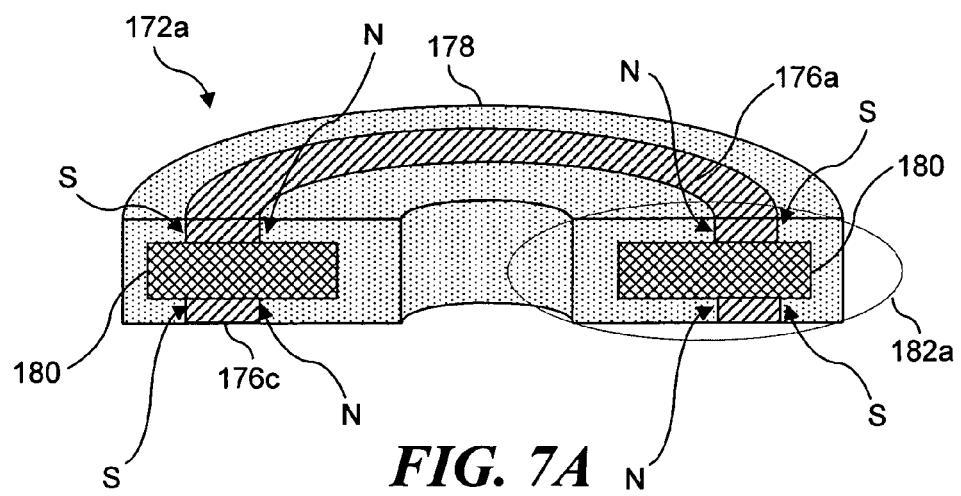
Figure 7B:
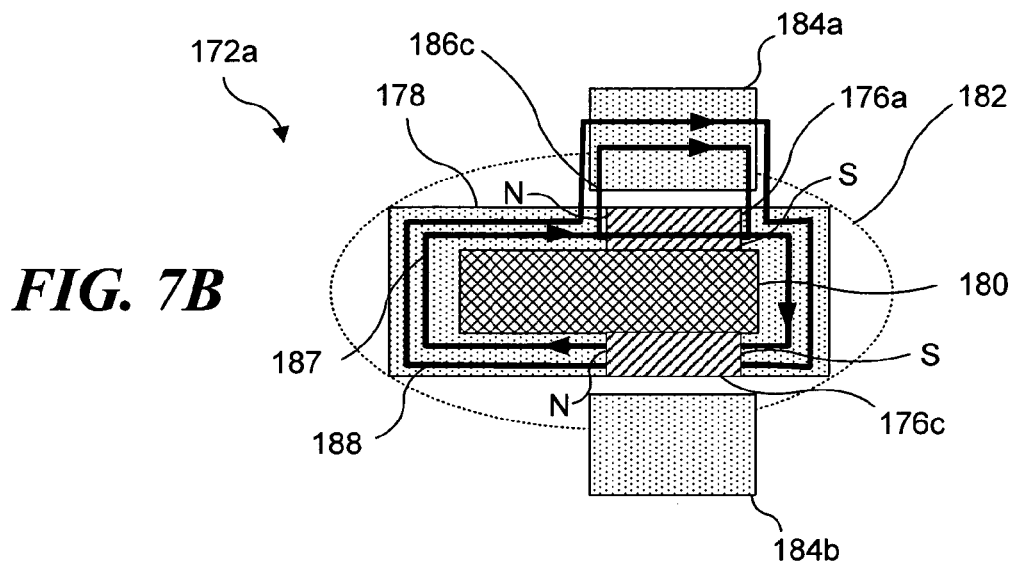
Figure 7C:
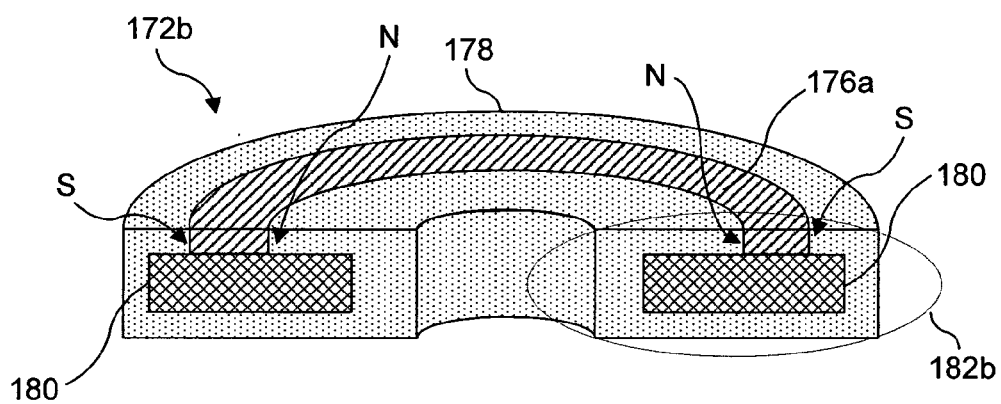
Figure 7D:
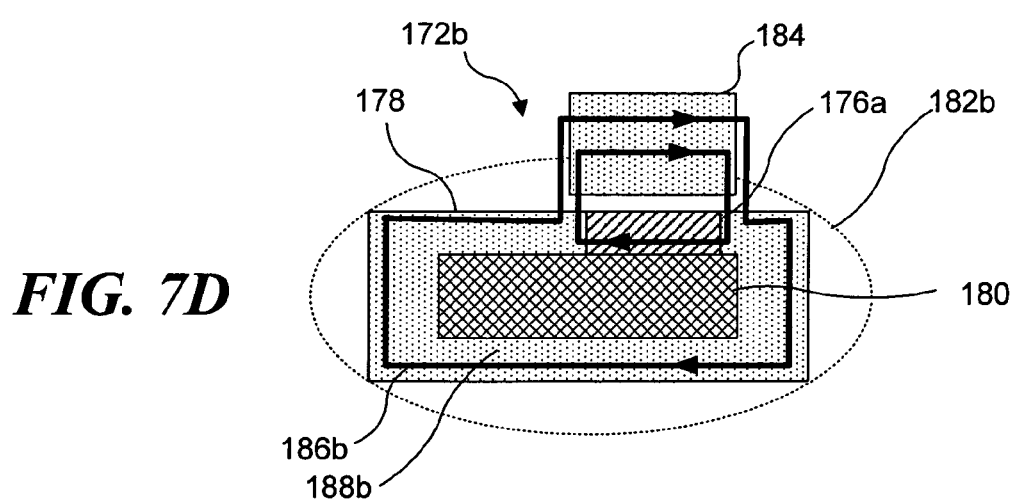
Figure 8A:
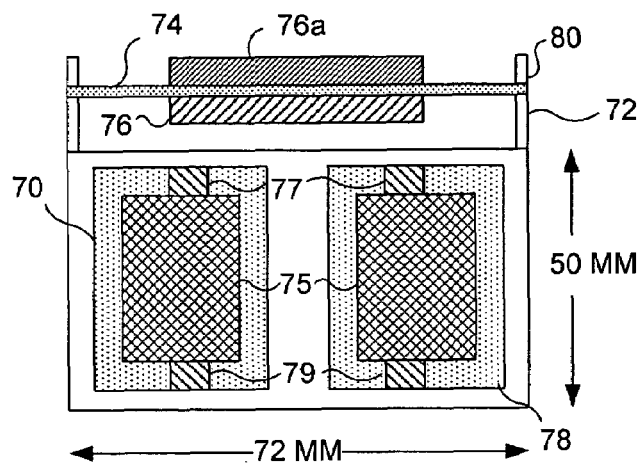
Figure 8B:
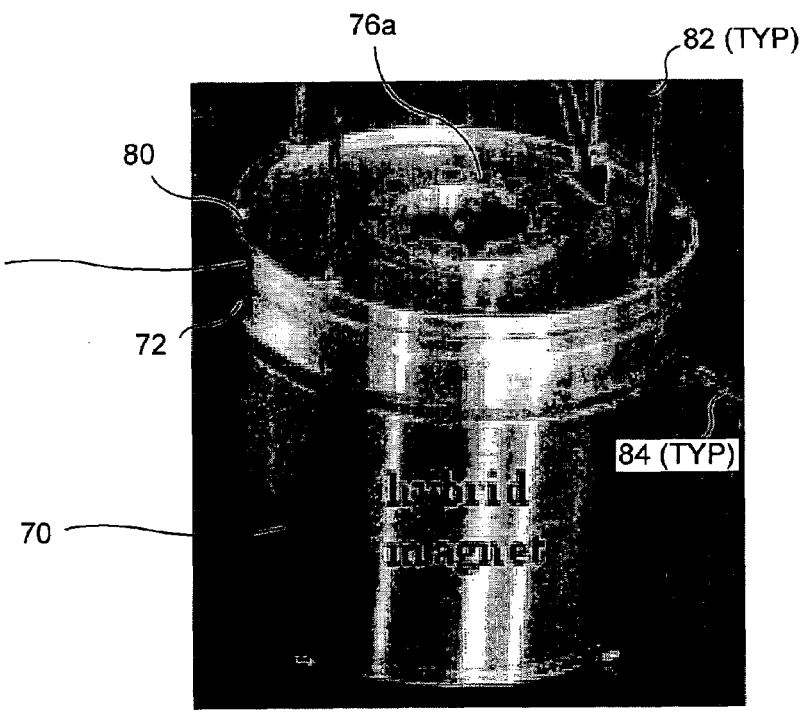
Figure 9A:
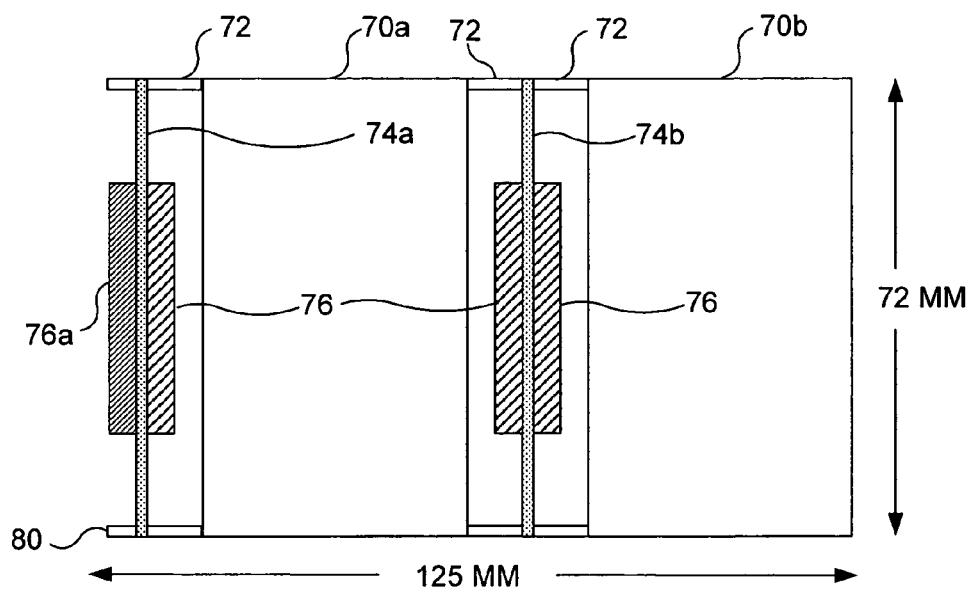
Figure 9B:
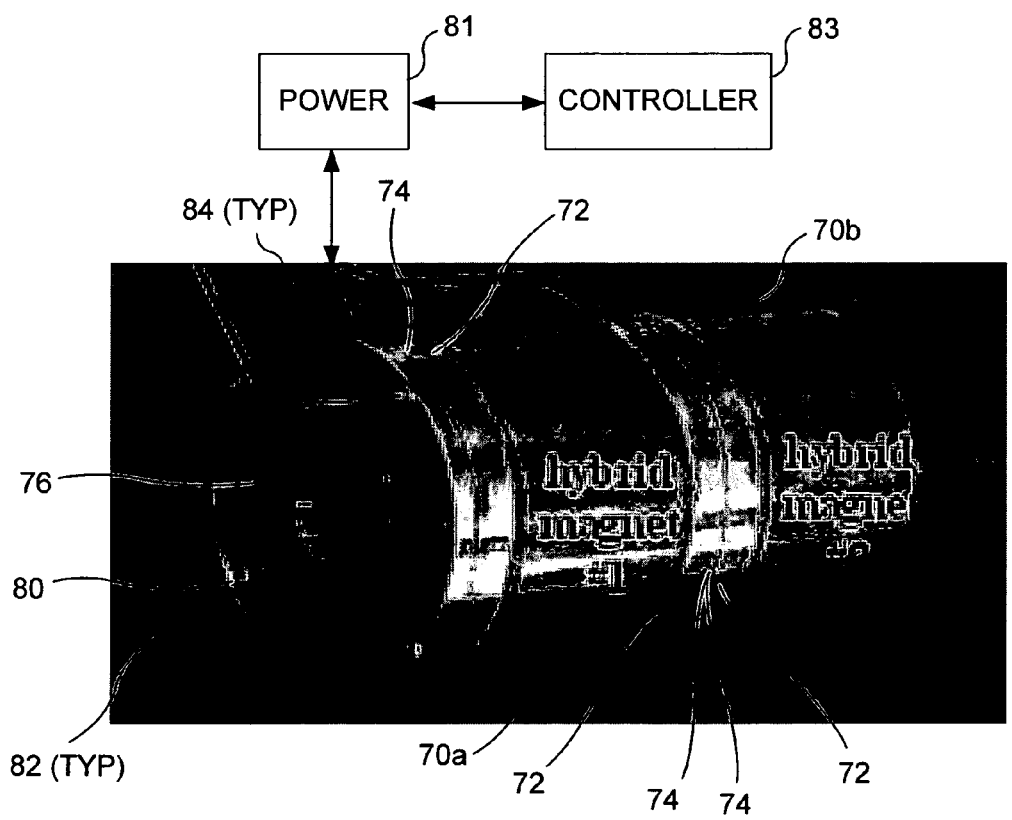
Figure 10A:
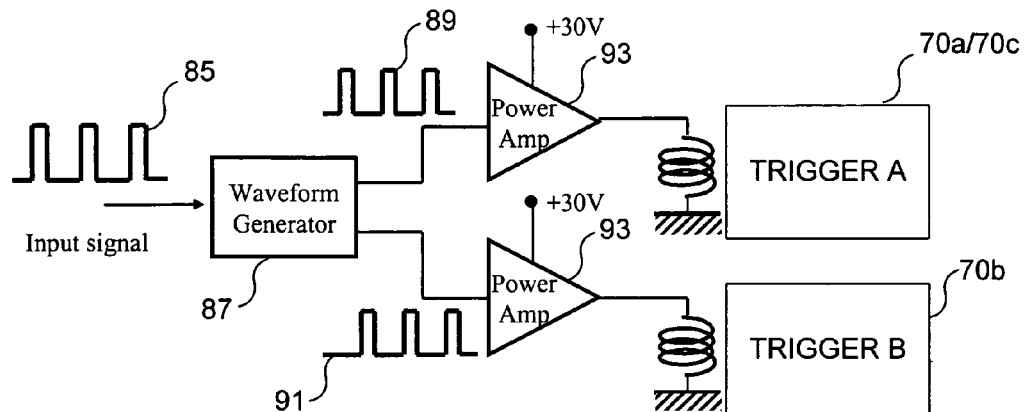
Figure 10B:
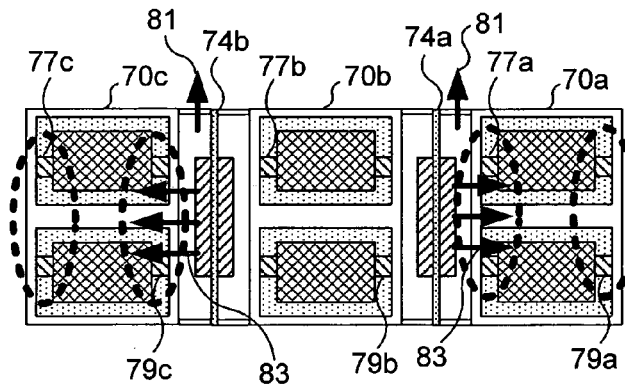
Figure 10C:
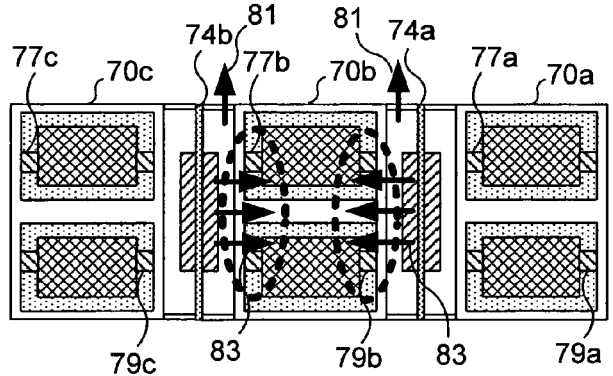
Figure 10D:
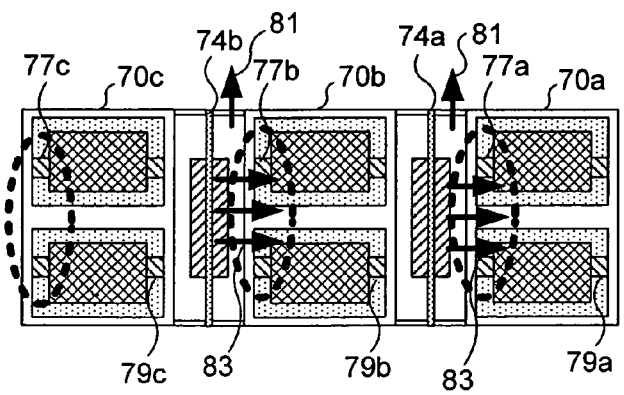
Figure 10E:
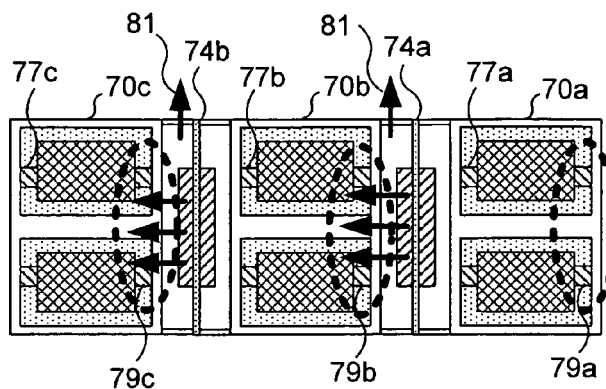
Figure 11:
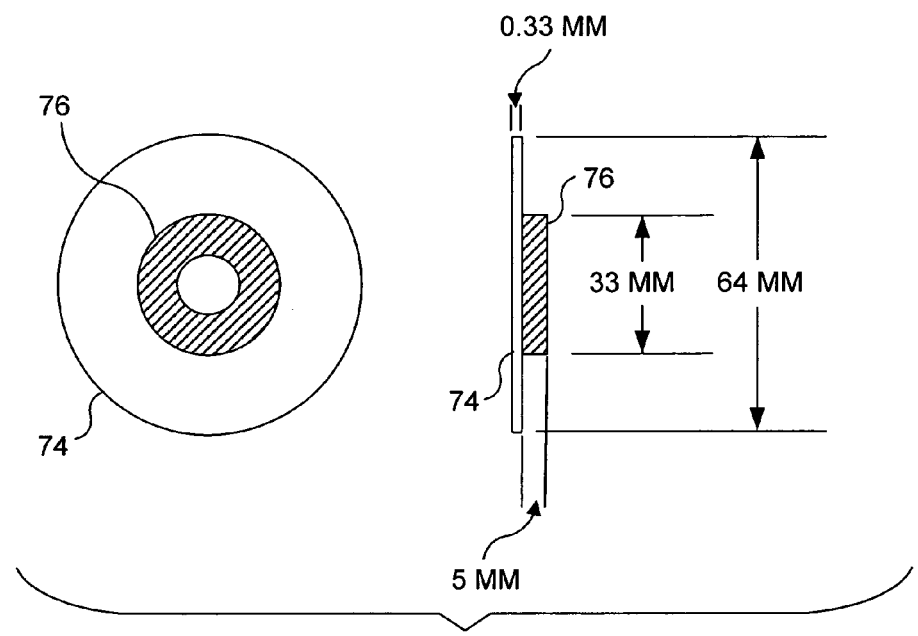
Figure 12:
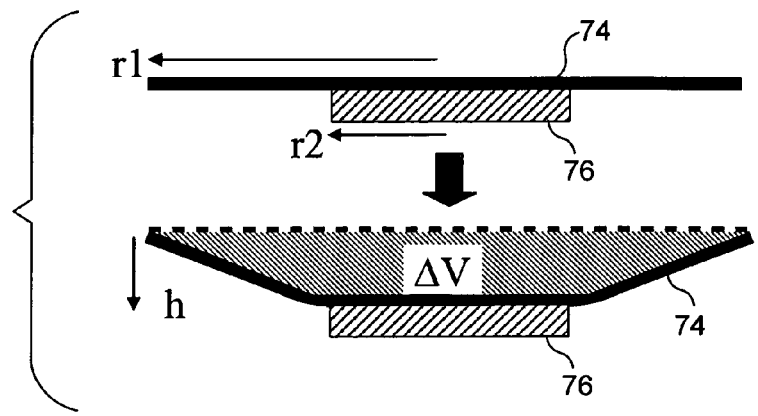
Figure 13A:
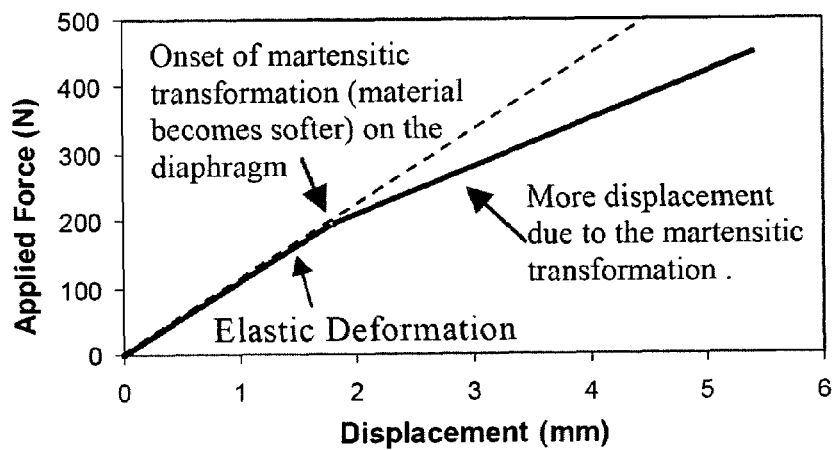
Figure 13B:
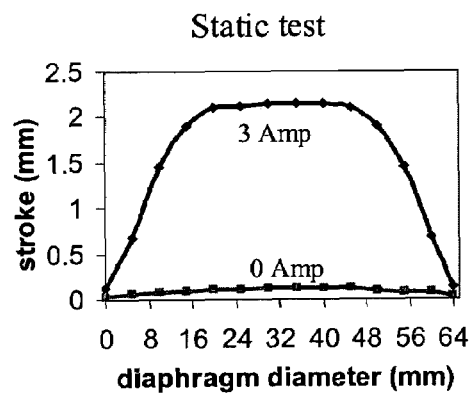
Figure 13C:
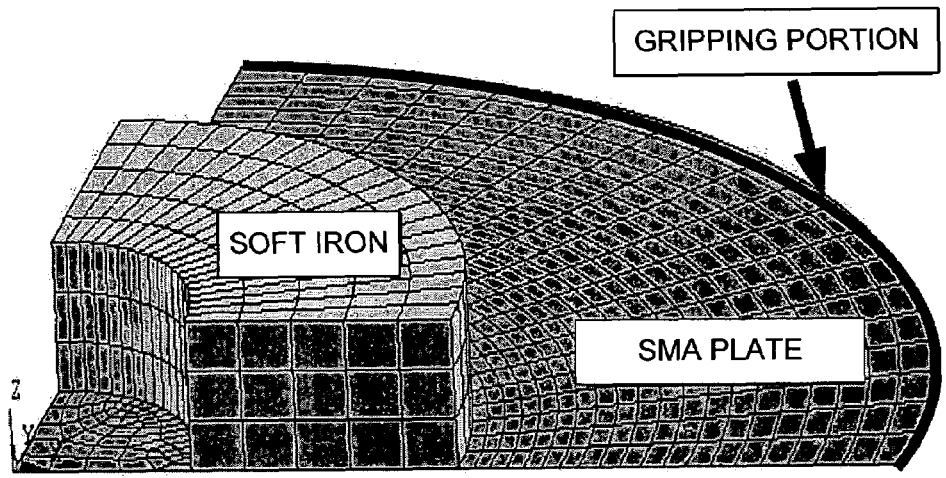
Figure 13D:
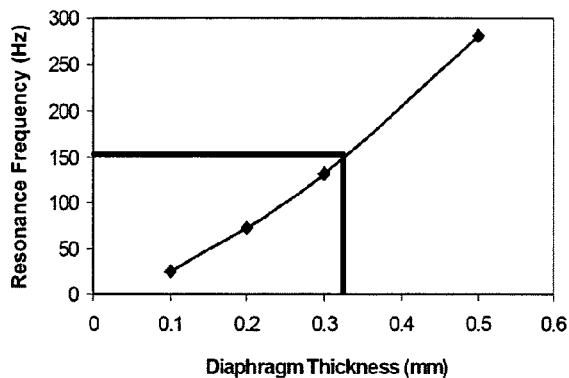
Figure 13E:
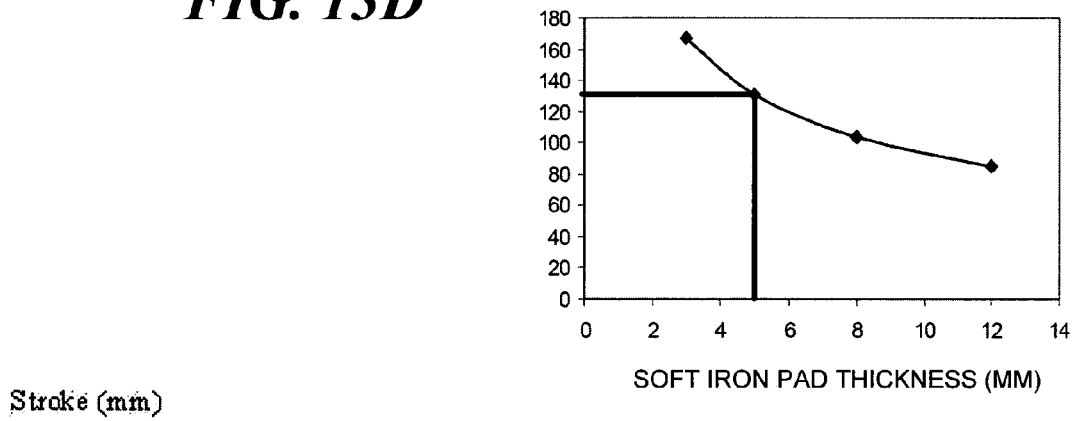
Figure 13F:
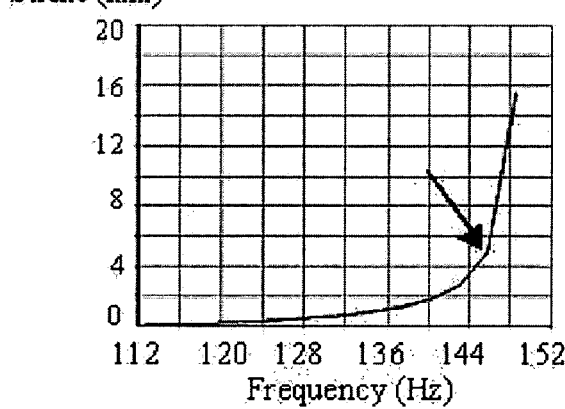
Figure 13G:
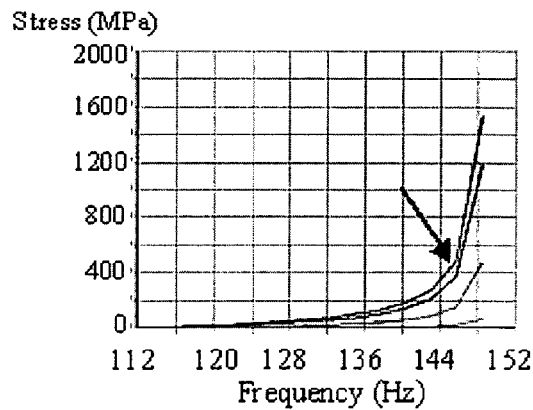
Figure 15:
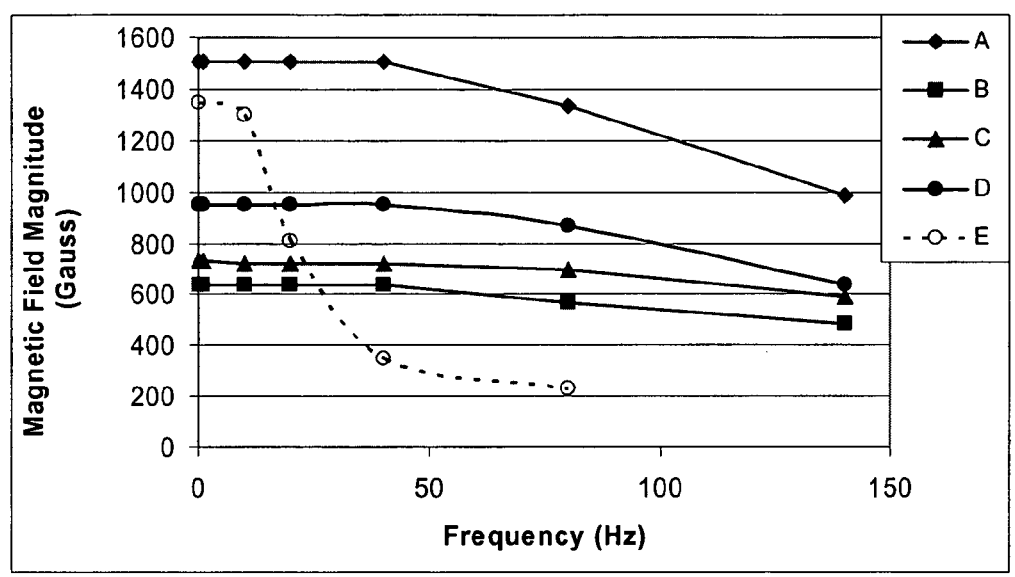
Figure 16:
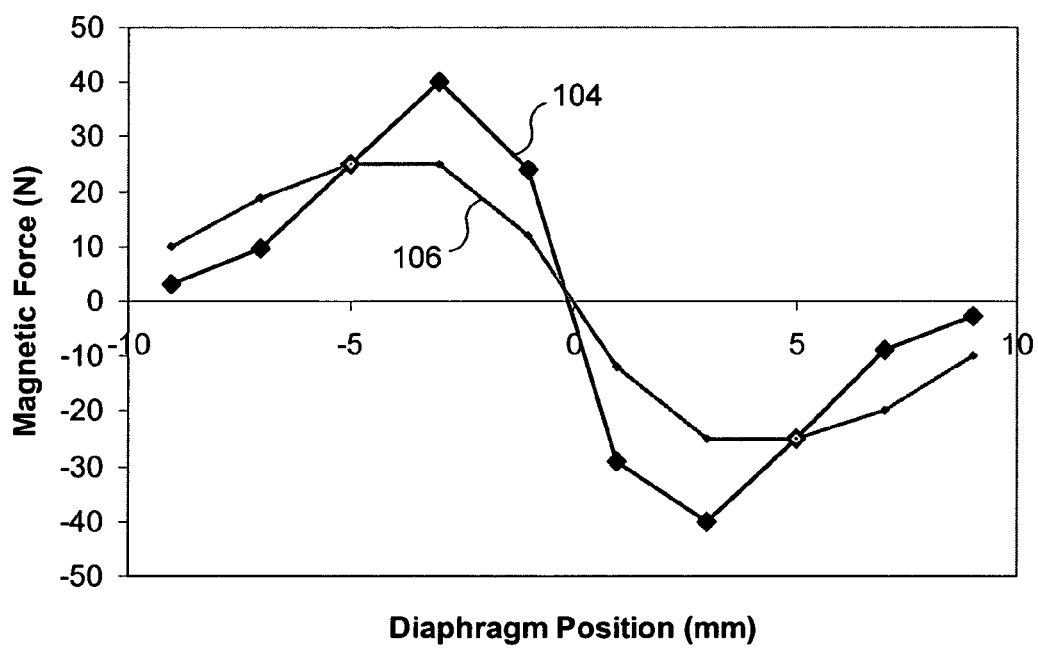
Figure 17A:
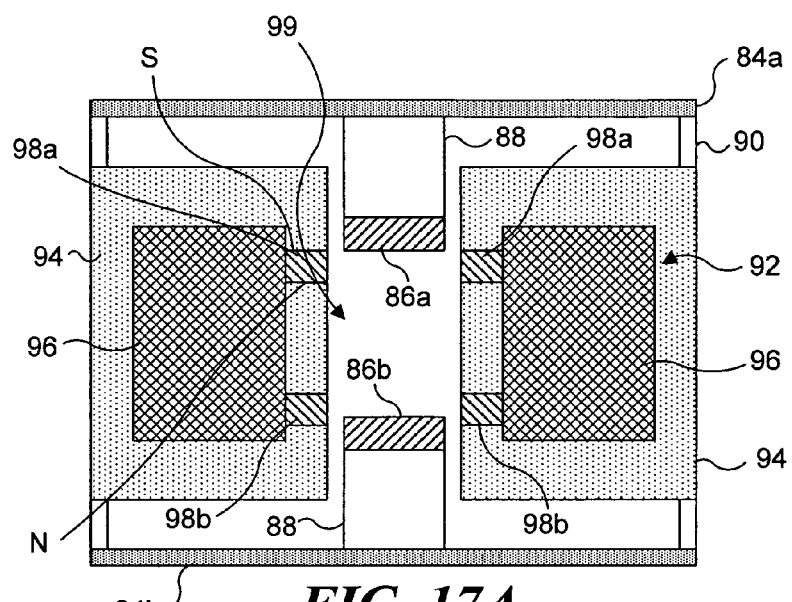
Figure 17B:
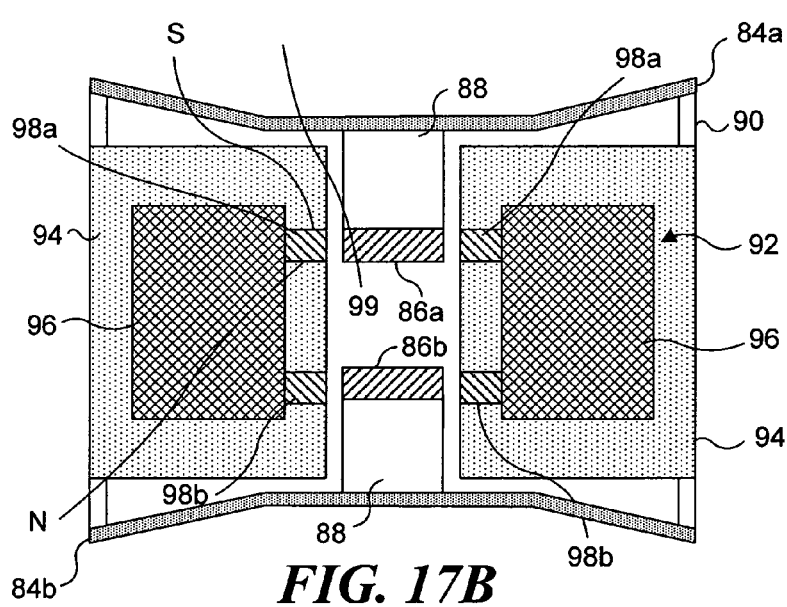
Figure 18A:
Figure 18B:
Figure 18C:
Figure 19A:
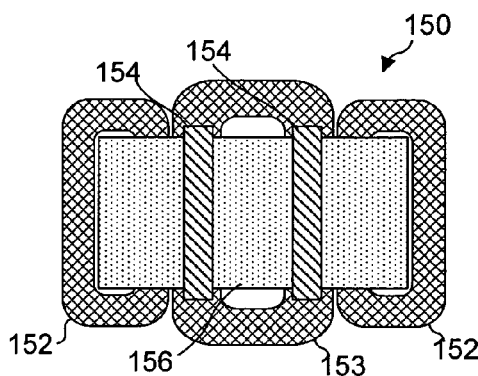
Figure 19B:
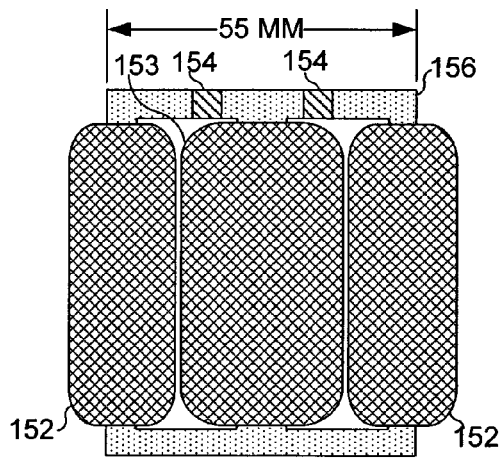
Figure 19C:
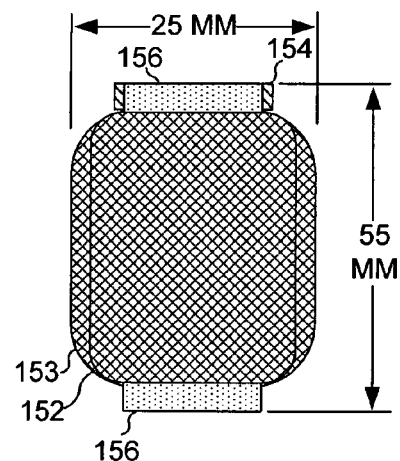
Figure 19D:
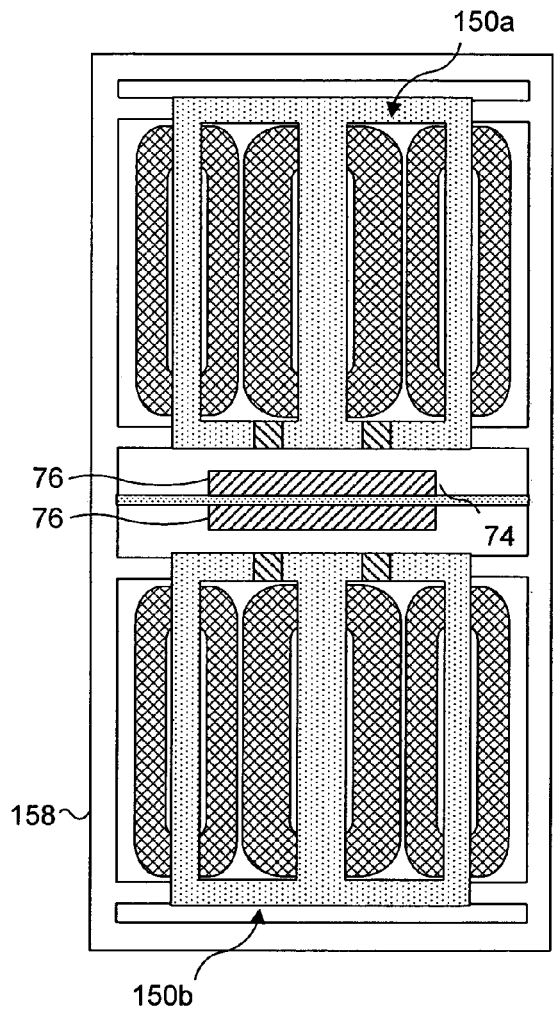
Figure 20A:
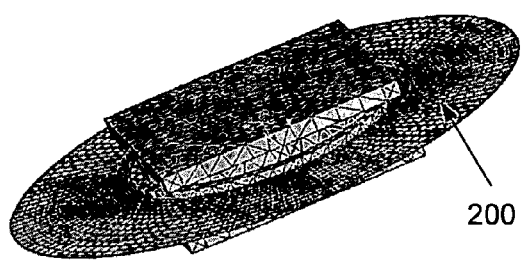
Figure 20B:
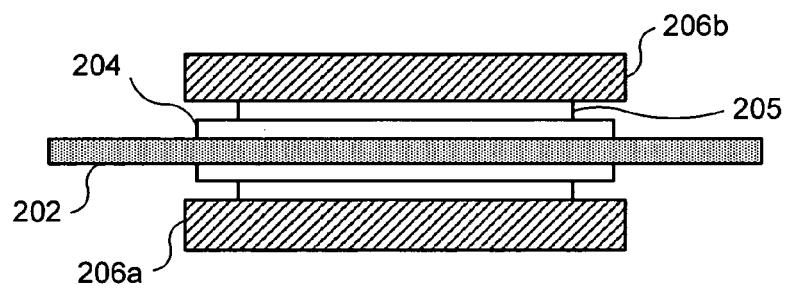
Figure 21A:
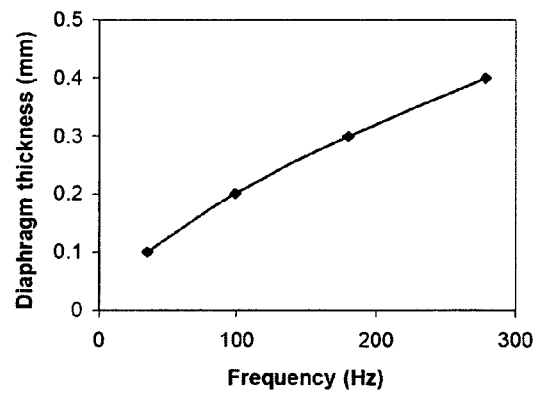
Figure 21B:
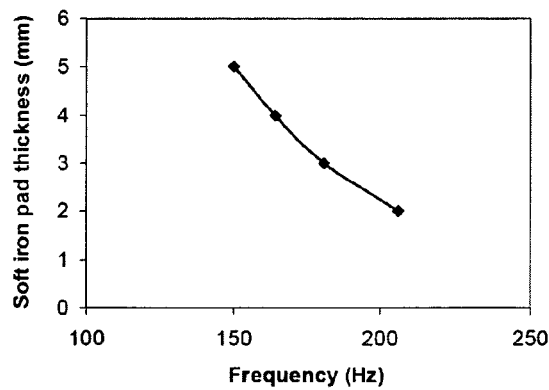
Figure 23:
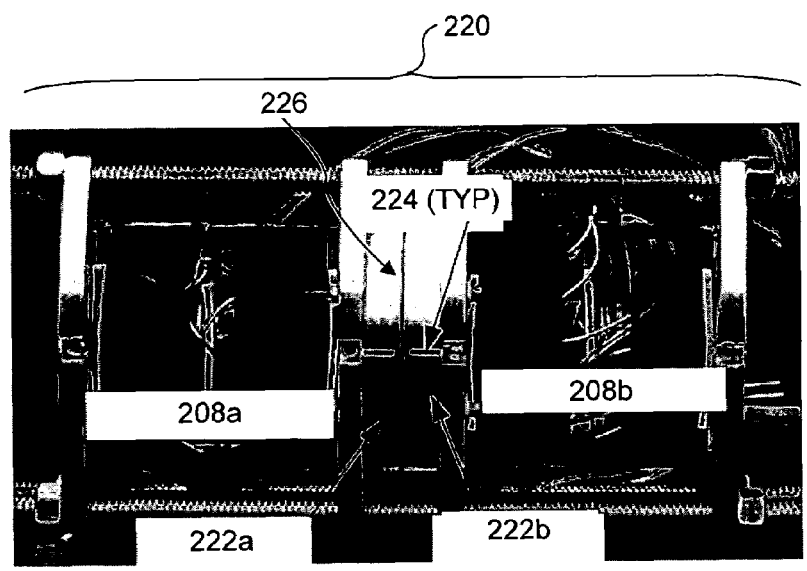
Figure 24A:
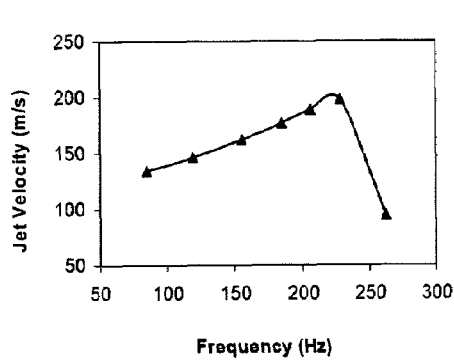
Figure 24B:
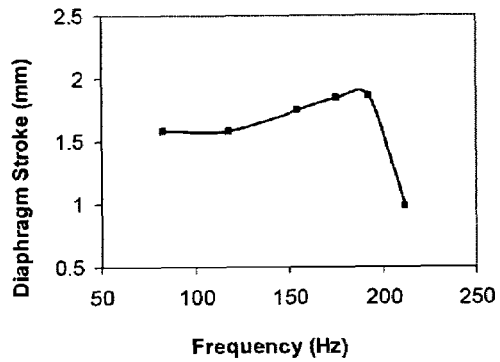
Figure 24C:
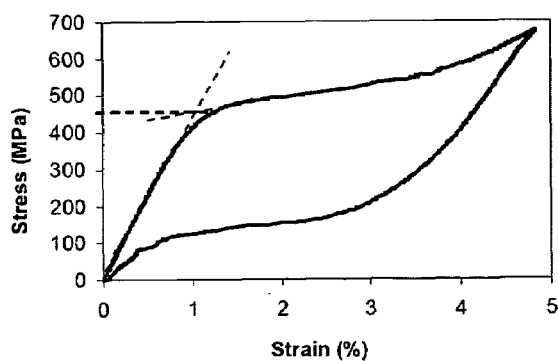

FIG. 7A schematically illustrates a cross-sectional configuration of yet another exemplary hybrid magnetic trigger for use in the SMA diaphragm actuator of FIG. 5B;

FIG. 7B is an enlarged view of a portion of the hybrid magnetic trigger of FIG. 7A and provides a visual representation of magnetic forces when the electromagnet is energized;

FIG. 7C schematically illustrates a cross-sectional configuration of an exemplary hybrid magnetic trigger for use in the SMA diaphragm actuator of FIG. 5A;

FIG. 7D is an enlarged view of a portion of the hybrid magnetic trigger of FIG. 7C and provides a visual representation of magnetic forces when the electromagnet is energized;

FIG. 8A schematically illustrates an SMA diaphragm actuator including a hybrid magnetic trigger and an SMA diaphragm, which was fabricated to provide a working model of the SMA diaphragm actuator in accord with the present invention;

FIG. 8B is a photograph of a working model corresponding to the SMA diaphragm actuator of FIG. 8A;

FIG. 9A schematically illustrates how additional hybrid magnetic triggers and SMA diaphragms can be added to the SMA actuator of FIG. 8A;

FIG. 9B is a photograph of a working model corresponding to the illustration of FIG. 9A;

FIG. 10A schematically illustrates a system for controlling the plurality of hybrid magnetic triggers in FIGS. 9A and 9B;

FIGS. 10B and 10C schematically illustrate a first actuation sequence for controlling a plurality of hybrid magnetic triggers in an SMA membrane actuator that is based on the configuration shown in FIGS. 9A and 9B;

FIGS. 10D and 10E schematically illustrate a second actuation sequence for controlling a plurality of hybrid magnetic triggers in an SMA membrane actuator based on the configuration of FIGS. 9A and 9B;

FIG. 11 schematically illustrates the SMA diaphragm used in the working models of FIGS. 8B and 9B;

FIG. 12 schematically illustrates the deformation of the SMA diaphragm obtained in the working models of FIGS. 8B and 9B;

FIG. 13A graphically illustrates a force and displacement relationship for the SMA diaphragm implemented in the working models of FIGS. 8B and 9B;

FIG. 13B graphically illustrates the displacement of the SMA diaphragm obtained in the working models of FIGS. 8B and 9B;

FIG. 13C schematically illustrates a finite element analysis model used to predict the operating characteristics of the SMA diaphragm of FIG. 12;

FIG. 13D graphically illustrates the relationship between resonance frequency and plate thickness for the SMA diaphragm of FIG. 12;

FIG. 13E graphically illustrates the relationship between resonance frequency and plate thickness for a ferromagnetic mass;

FIG. 13F graphically illustrates the relationship between the stroke on center and frequency for the SMA diaphragm of FIG. 12;

FIG. 13G graphically illustrates the relationship between stress and frequency for the SMA diaphragm of FIG. 12;

FIGS. 14A-14E schematically illustrate designs for hybrid magnetic triggers which have been empirically investigated; and FIG. 15 graphically illustrates force and frequency relationships empirically determined for the hybrid magnetic trigger designs of FIGS. 14A-14E; and FIG. 16 graphically illustrates a predicted force and displacement relationship for the SMA diaphragm actuators of FIGS. 5A and 5B;

FIG. 17A schematically illustrates another embodiment of an SMA diaphragm actuator including a hybrid magnetic trigger and a pair of SMA diaphragms;

FIG. 17B schematically illustrates a potential actuation sequence for the SMA diaphragm actuator of FIG. 17A;

FIG. 18A schematically illustrates a magnet configuration for an upper permanent magnet in the SMA diaphragm actuator of FIG. 17A;

FIG. 18B schematically illustrates a magnet configuration for a lower permanent magnet in the SMA diaphragm actuator of FIG. 17A;

FIG. 18C schematically illustrates a different magnet configuration for the lower permanent magnet in the SMA diaphragm actuator of FIG. 17A;

FIG. 19A is a plan view of yet another embodiment of a hybrid magnetic trigger;

FIG. 19B is a side elevational view of the hybrid magnetic trigger of FIG. 16A;

FIG. 19C is an end view of the hybrid magnetic trigger of FIG. 19A;

FIG. 19D is a cross-sectional view of a synthetic jet actuator including one SMA member and two of the hybrid magnetic triggers of FIG. 19A;

FIG. 20A is a model of a composite SMA diaphragm for use in an improved actuator in accord with the present invention;

FIG. 20B is a side elevational view of the composite SMA diaphragm of FIG. 20A;

FIG. 21A graphically illustrates the relationship between resonance frequency and plate thickness for the composite SMA diaphragm of FIG. 20A;

FIG. 21B graphically illustrates the relationship between resonance frequency and thickness for a ferromagnetic mass for use in the composite SMA diaphragm of FIG. 20A;

FIG. 22A is a cross-sectional view of an improved hybrid magnetic trigger in accord with another aspect of the present invention;

FIG. 22B schematically illustrates the magnetic flux in the hybrid magnetic trigger of FIG. 22A when the hybrid magnetic trigger is not energized;

FIG. 22C schematically illustrates the magnetic flux in the hybrid magnetic trigger of FIG. 22A when the hybrid magnetic trigger is energized, indicating magnetic flux being directed out of the hybrid magnetic trigger and towards an adjacent ferromagnetic mass;

FIG. 22D graphically illustrates the relationship between magnetic force and frequency for the hybrid magnetic trigger of FIG. 22A;

FIG. 23 is an image of a working actuator fabricated using a single composite SMA diaphragm of FIG. 20A and a pair of the hybrid magnetic triggers of FIG. 22A;

FIG. 24A graphically illustrates the relationship between synthetic jet velocity and drive frequency for the actuator of FIG. 23;

FIG. 24B graphically illustrates the relationship between diaphragm stroke and drive frequency for the actuator of FIG. 23; and FIG. 24C graphically illustrates the relationship between stress and strain for the composite diaphragm implemented in the actuator of FIG. 23.

DESCRIPTION OF THE PREFERRED EMBODIMENT

In a broad context, the present invention is directed to magnetically actuating an SMA diaphragm. It should be understood that the terms "membrane" and "diaphragm" are used interchangeably in the following specification. As used herein and in the claims that follow, the terms "membrane" and "diaphragm" refer to a three-dimensional mass of material characterized as having a first dimension that it substantially smaller than its other dimensions. Disks and sheets are common three-dimensional shapes in which a first dimension (generally referred to as thickness) is substantially smaller than other dimensions (such as width and length or depth). A particularly preferred three-dimensional shape for membranes/diaphragms in accord with the present invention is a disk; however, it should be understood that disks are merely exemplary of the shape of the membrane/diaphragm, and the invention is not limited in anyway to membranes/diaphragms that are disk shaped.

Figure 1A:
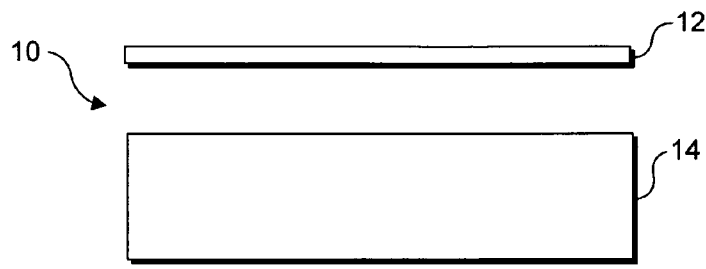
Figure 1B:
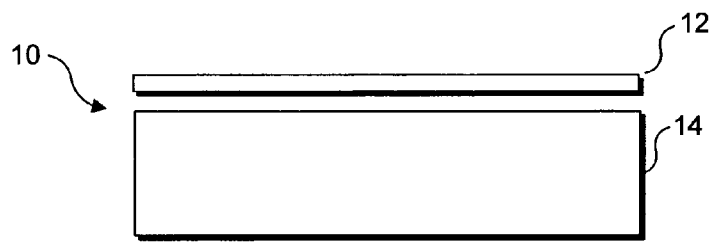

FIG. 1A schematically illustrates a membrane actuator 10, including a magnetically actuatable SMA membrane 12 and a magnetic trigger 14. FIG. 1B shows membrane actuator 10 after magnetic trigger 14 has been activated, causing magnetically actuatable SMA membrane 12 to move closer to the magnetic trigger. Note that FIG. 1B simply shows the entire mass of SMA membrane 12 moving closer to magnetic trigger 14. As will be discussed in greater detail below, in at least some embodiments of the present invention, a portion of SMA membrane 12 remains fixed in position relative to magnetic trigger 14 during actuation, while one or more other portion(s) of the membrane reversibly deform(s). By using an SMA to implement the membrane, the membrane actuator is able to produce a larger force than could readily be achieved using non-SMA membranes. Preferably, the magnetic trigger can supply a magnetic field gradient sufficient to induce stress-induced martensitic phase transformation in the SMA membrane, thus enhancing the displacement of the membrane during actuation. Magnetic trigger 14 can be implemented with either a permanent magnet and/or electromagnet.

If magnetic trigger 14 is implemented with a permanent magnet, actuation can be achieved by moving magnetic trigger 14 relative to SMA membrane 12, until the magnetic gradient provided by the permanent magnet causes the SMA membrane to deform. While technically possible to implement, such a configuration requires a prime mover to move the magnetic trigger, which will increase the cost, size, weight, and complexity of a membrane actuator. If magnetic trigger 14 is implemented with an electromagnet, a prime mover is not required to actuate the membrane. Use of an electromagnet to implement magnetic trigger 14 enables simple, compact, and readily controllable membrane actuators to be achieved.

Before discussing membrane actuator 10 further, it may be helpful to review the mechanisms by which phase transformations are induced in SMAs. The three mechanisms associated with SMAs that can be utilized to cause the actuator membrane to transform and provide the actuation movement are: (i) magnetic field-induced phase transformation; (ii) Martensite variant rearrangement; and, (iii) a hybrid mechanism. The hybrid mechanism involves sequential events, including applying a magnetic field gradient, such that magnetic force and stress induce a phase transformation from stiff Austenite to soft Martensite, which contributes to a greater Martensite change and provides a larger displacement or stroke. To enable a large stroke to be achieved, the hybrid mechanism is preferred. Any type of magnet can be used to expose the SMA membrane to a magnetic gradient. To ensure that the SMA membrane is exposed to the stress required to induce the hybrid mechanism, at least a portion of the SMA membrane must be ferromagnetic, so that the SMA membrane is attracted to the magnetic trigger, thereby stressing the SMA membrane and enhancing the phase transformation from stiff Austenite to soft Martensite.

Figure 2:
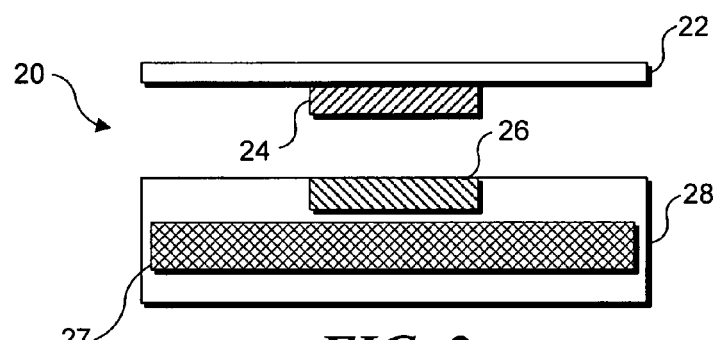

One possible implementation of SMA membrane 12 would be to employ a material that is not only an SMA, but is also ferromagnetic. Several different types of FMSA are known, including an alloy of iron and palladium (FePd). Unfortunately, FePd is an expensive material, and widespread commercial adoption of this technology will likely only be facilitated if lower-cost alternatives are available. Another possible implementation of a magnetically actuatable membrane that includes an SMA includes a mass of ferromagnetic material attached to a non-ferromagnetic SMA membrane. FIG. 2 schematically illustrates a membrane actuator 20 that includes a non-ferromagnetic SMA membrane 22, to which a ferromagnetic mass 24 has been attached. A further improvement is the use of a hybrid magnetic trigger 28 in place of magnetic trigger 14. As discussed above, electromagnets offer significant advantages over the use of permanent magnets. A hybrid magnetic trigger includes both an electromagnet and a permanent magnet. When properly designed, the magnetic gradient provided by the electromagnet portion of the hybrid magnetic trigger significantly enhances the magnetic gradient provided by the permanent magnet, and a stronger magnetic gradient can be achieved than would be possible using only an electromagnet of the same size. Thus, hybrid magnetic trigger 28 includes both an electromagnet 27 and a permanent magnet 26.

Figure 3:
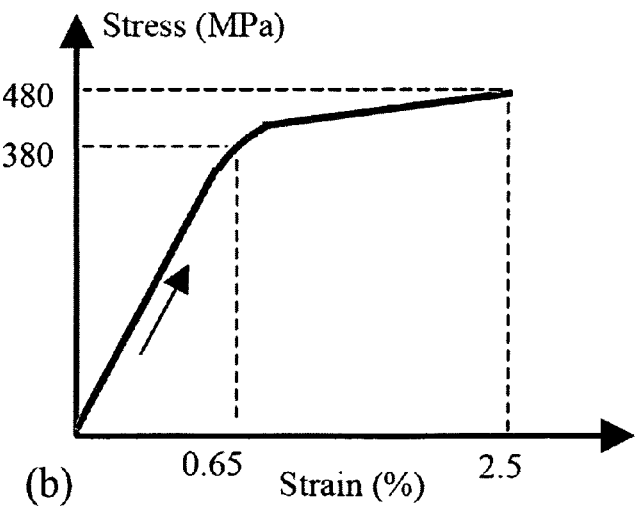

Many different combinations of ferromagnetic materials and non-ferromagnetic SMAs can be employed to achieve a magnetically actuatable SMA membrane. For example, the ferromagnetic material can be iron, or an iron, cobalt, and vanadium alloy (FeCoV); and the SMA can be an alloy of nickel and titanium (NiTi), or an alloy of nickel, titanium, and copper (NiTiCu). FIG. 3 graphically illustrates the force and strain relationship for NiTi. As discussed in detail below, working models have been fabricated using a NiTi disk, a mass of iron attached to the NiTi disk, and a hybrid magnetic trigger.

Figure 4A:
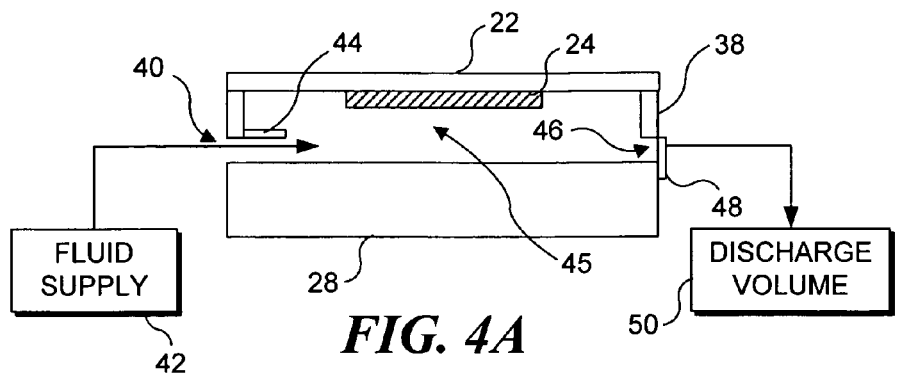
Figure 4B:
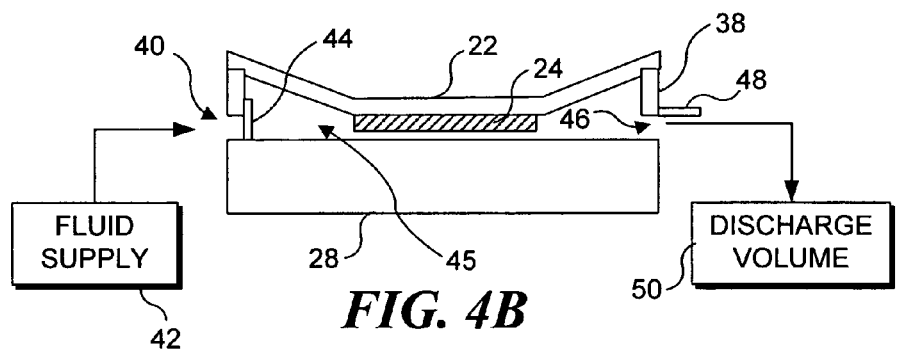

The magnetically actuatable SMA membrane actuators of the present invention can be used in a variety of different devices. It should be understood however, that the following implementations are intended to be exemplary, rather than limiting of the scope of the present invention. FIGS. 4A-4D schematically illustrate preferred applications. Specifically, FIG. 4A schematically illustrates SMA membrane 22, ferromagnetic mass 24, and hybrid magnetic trigger 28 (note that for simplicity the permanent magnet and electromagnet portions of hybrid magnetic trigger 28 have been omitted) incorporated into a housing 38 and intended to function as a pump. Housing 38 includes a fluid inlet 40 and a fluid outlet 46. Fluid inlet 40 is placed in fluid communication with a fluid supply 42, and fluid outlet 46 is placed in fluid communication with a discharge volume 50. Flapper valves 44 and 48 selectively place working volume 45 in fluid communication with either fluid supply 42 or discharge volume 50. FIG. 4A shows the pump with SMA membrane 22 in a normal rest position. FIG. 4B shows the pump after hybrid magnetic trigger 28 has been energized to actuate SMA membrane 22 (i.e., to cause SMA membrane 22 to deform). In FIG. 4A, valve 44 is open, and fluid from fluid supply 42 enters operating volume 45, while valve 48 is closed, preventing fluid from operating volume 45 from reaching discharge volume 50. In FIG. 4B, valve 44 is closed, and valve 48 is open, allowing fluid in operating volume 45 to be discharged into discharge volume 50. Repeated actuation of SMA membrane 22 will result in fluid being pumped from fluid supply 42 to discharge volume 50. The SMA membrane actuator of the present invention can be used to achieve a pump producing a large force and/or a large stroke. Because the SMA membrane actuators of the present invention are relatively compact and lightweight, smaller and lighter hydraulic pumps can be achieved, as compared to pumps that use heavy gears and motors.

With respect to pumping applications, it should be understood that the membrane actuators of the present invention can be implemented in a wide variety of pumps. Such membrane actuators can be used in hydraulic pumps, gas pumps, and gas compressors. Such devices have wide variety of applications, and the examples provided herein are intended to be exemplary, rather than limiting the invention. One exemplary pumping application for membrane actuators of the present invention is to provide fuel injection for gasoline engines and diesel engines.

Figure 4C:
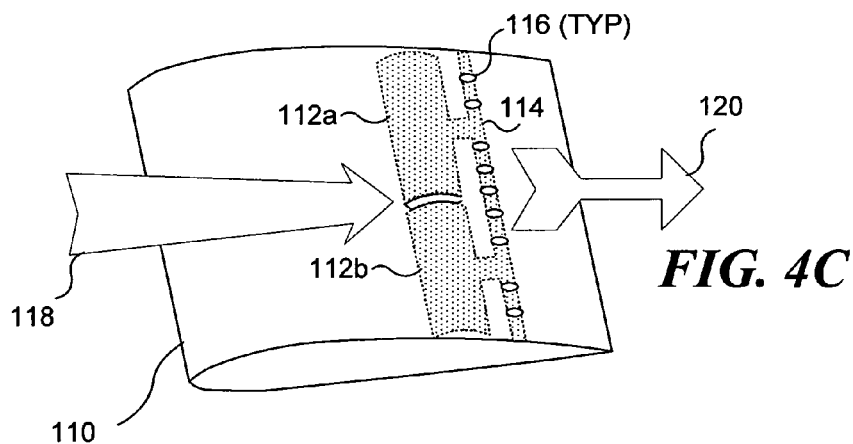

FIG. 4C schematically illustrates membrane actuators 112a and 112b being incorporated into a wing 110 of an aircraft (not separately shown). Membrane actuators 112a and 112b are in fluid communication with a slot 114. Openings 116 in the wing surface are in fluid communication with slot 114. Synthetic jets produced by membrane actuators 112a and 112b are directed upward and away from wing 110. The synthetic jets modify airflow 118, resulting in a modified airflow 120 downstream of openings 116. The orientation of the membrane actuators, slot 114, and openings 116 will be a function of the specific wing being modified, and vary according to the goals for the modified airflow. The SMA membrane actuators of the present invention can help aircraft improve aerodynamic performance and stabilize flight at a low Mach number by injecting high momentum air into the airflow at the appropriate locations on aircraft wings. The jet flow is controlled by the orifices on the wing surfaces to increase the cruise lift and the angle of attack of the wings.

Figure 4D:
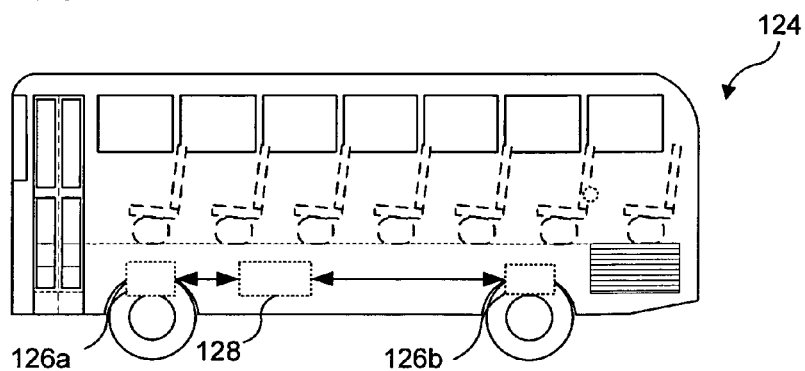

FIG. 4D schematically illustrates a vehicle 124, which includes a suspension incorporating SMA membrane actuators 126a-126d (SMA membrane actuators 126c and 126d are positioned on the suspension system of the other two wheels, which are hidden from view in FIG. 4D). Each SMA membrane actuator is controllably coupled to a processor 128, which can be an existing onboard computer, or an additional processor. The membrane actuators serve as an active suspension to control the vehicle's suspension performance. Because the SMA membrane actuators of the present invention exhibit rapid cycling times, such an active suspension will be able to provide high performance over bumpy roads and at high speeds. Such a suspension system will be appropriate not only for heavy-duty vehicles traveling over bumpy roads, but also for high-performance passenger vehicles and sports cars.

While many different designs of SMA membrane actuators including hybrid magnetic triggers are possible, FIGS. 5A and 5B illustrate two designs that appear to be particularly beneficial. FIG. 5A schematically illustrates an actuator design in which two hybrid magnetic triggers are configured to alternately actuate the same SMA membrane. FIG. 5B schematically illustrates an actuator design in which one hybrid magnetic trigger is configured to simultaneously or alternately actuate two different SMA membranes. Referring to FIG. 5A, an SMA membrane 22a is disposed between two hybrid magnetic triggers 28a and 28b. A ferromagnetic mass 24a is attached to an upper face of SMA membrane 22a, and a ferromagnetic mass 24b is attached to a lower face of SMA membrane 22a. When hybrid magnetic trigger 28a is energized, ferromagnetic mass 24a and SMA membrane 22a are attracted to hybrid magnetic trigger 28a, as indicated by arrow 52. When hybrid magnetic trigger 28b is energized, ferromagnetic mass 24b and SMA membrane 22a are attracted to hybrid magnetic trigger 28b, as indicated by arrow 54. Of course, if each hybrid magnetic trigger exerts the same magnetic gradient, each trigger is disposed at the same distance from SMA membrane 22a, and each hybrid magnetic trigger is actuated simultaneously, SMA membrane 22a will not move. Clearly, if the hybrid magnetic triggers are operated alternately in a repeating sequence, then SMA membrane 22 will reciprocate back and forth between the two hybrid magnetic triggers. While no housing is shown relative to the hybrid magnetic triggers and the SMA membrane, it should be understood that the components can readily be disposed in a housing, and such a housing can include one or more fluid inlets to enable this actuator design to produce a synthetic jet, or to serve as a pump, generally as described above.

Referring now to FIG. 5B, a hybrid magnetic trigger 60 is disposed in a generally cylindrical housing 62. A first SMA membrane 22b is disposed at a first open end of housing 62, and a second SMA membrane 22c is disposed in a second open end of a housing 62, thereby dividing the housing into working volumes 63 and 65. If desired, working volume 63 and 65 can be placed in fluid communication, and only one opening 64 can be implemented to place the combined working volumes in fluid communication with an ambient volume. The number of openings in housing 62 will be a function of its intended use. SMA membrane actuators used for pumping applications will likely have different housing configurations than SMA membrane actuators used for the modification of airflow over a wing, or in suspension systems. It should be understood that housing 62 is intended to be exemplary, rather than limiting on the scope of this invention.

Figure 6A:
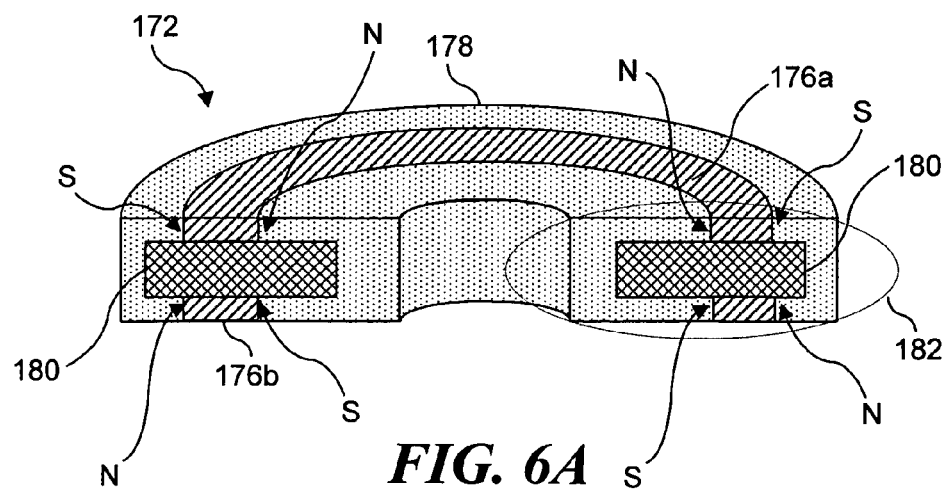
FIG. 6B is an enlarged view of a portion of the hybrid magnetic trigger of FIG. 6A, and provides a visual representation of magnetic forces when the electromagnet is not energized.
FIG. 6C shows the portion of the hybrid magnetic trigger of FIG. 6A, with a visual representation of magnetic forces when the electromagnet is energized.

FIG. 6A schematically illustrates a cross section of an exemplary hybrid magnetic trigger 172, which includes an electromagnet 180 and ring-shaped permanent magnets 176a and 176b. Because hybrid magnetic trigger 172 includes a pair of permanent magnets on opposing faces, hybrid magnetic trigger 172 is configured to be utilized in the SMA actuator schematically illustrated in FIG. 5B. It should be noted that FIG. 6A is not intended to show each component to scale, but is instead intended to illustrate the structural relationship of the components included in exemplary hybrid magnetic triggers. An energy source and conductors coupling the electromagnet to the energy source have been omitted to simplify the Figure, although those of ordinary skill will recognize that electromagnet 180 (as well as the electromagnets discussed above) must be energized with an electrical current provided by a power source, such as a battery, or a conventional power supply energized using an alternating current line connection. A yoke 178 is generally disk-shaped and is formed of a magnetically permeable material, such as iron. It should further be understood, however, that yoke 178 can be implemented in various shapes and sizes as desired, and disk-shaped yoke 178 is intended to be exemplary, rather than limiting on the scope of this invention. Hybrid magnetic trigger 172 includes a permanent magnet disposed both above and below electromagnet 180. This configuration facilitates the coupling of magnetic flux to diaphragms/membranes disposed both above and below hybrid magnetic trigger 172. If desired, permanent magnet 176b can be omitted, so that magnetic flux is directed into an SMA membrane disposed adjacent to permanent magnet 176a. The magnetic flux provided by such hybrid magnetic triggers in the energized state (i.e., when on) and non-energized state (i.e., when off) are schematically shown in FIGS. 7A-7C, based on a portion 182 of the cross-sectional view of FIG. 6A.

Figure 6B:
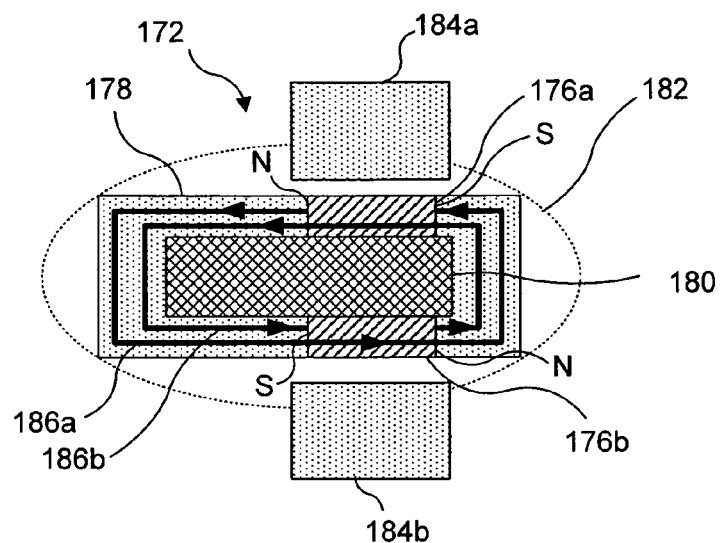

Referring to FIG. 6B, a flux line 186a is provided by permanent magnet 176a and establishes a closed loop within yoke 178. Similarly, a flux line 186b is provided by permanent magnet 176b and establishes a closed loop within yoke 178. The direction of the flux lines (counter-clockwise versus clockwise) is a function of the polar orientation of the corresponding permanent magnet. Conventionally, magnetic flux is considered to flow externally from a magnet's north pole to its south pole. If for example, the polar orientations of permanent magnets 176a and 176b were reversed, the direction of the magnetic flux would be reversed, as well. If the polar orientation of only one of the permanent magnets were reversed, then the direction of only one of the arrows representing the magnetic flux for that permanent magnet would be reversed.

When electromagnet 180 is not energized, the magnetic flux provided by permanent magnets 176a and 176b is insufficient to couple the required actuating magnetic force to either a ferromagnetic mass 184a or ferromagnetic mass 184b. In an assembled SMA membrane actuator, each ferromagnetic mass will be coupled to an SMA membrane, generally as described above. If an FSMA membrane is used in place of an SMA: membrane, a ferromagnetic mass is not required, and the hybrid magnetic trigger acts directly on the FSMA, as opposed to acting on a ferromagnetic mass coupled to the SMA membrane. A distance separating ferromagnetic mass 184a from permanent magnet 176a has been selected to ensure a magnetic gradient established by permanent magnet 176a is insufficient to cause ferromagnetic mass 184a (and the SMA membrane attached to ferromagnetic mass 184a) to move towards permanent magnet 176a while electromagnet 180 is not energized. Similarly, a distance separating ferromagnetic mass 184b from permanent magnet 176b has been selected to ensure a magnetic gradient established by permanent magnet 176b is insufficient to cause ferromagnetic mass 184b (and the SMA membrane attached to ferromagnetic mass 184b) to move towards permanent magnet 176b while electromagnet 180 is not energized.

Figure 6C:
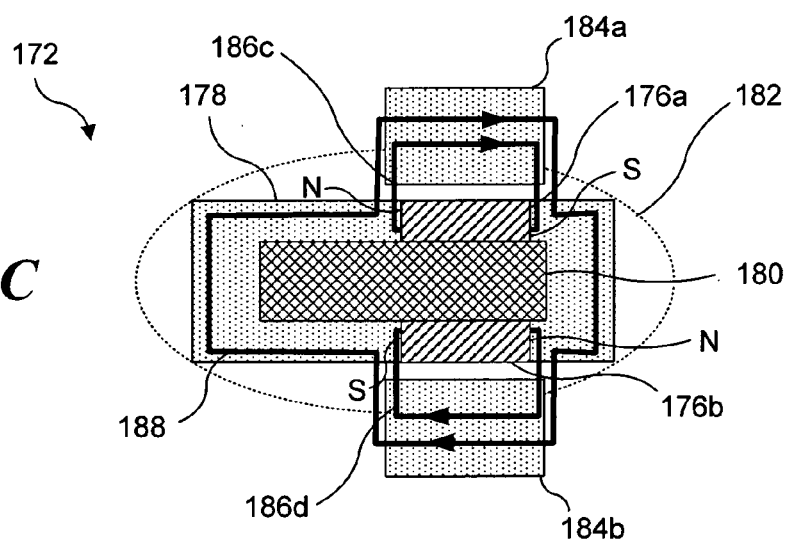

In FIG. 6C, electromagnet 180 has been energized, and the magnetic flux lines have changed. Flux line 186c from permanent magnet 176a now couples magnetic flux from permanent magnet 176a into ferromagnetic mass 184a. Flux line 188 from electromagnet 180 now couples magnetic flux from the electromagnet into ferromagnetic mass 184a. If ferromagnetic mass 184a is coupled to an SMA membrane, the ferromagnetic mass and the SMA membrane would be attracted to permanent magnet 176a, and if the magnetic gradient and stress applied to the SMA membrane are sufficient, a phase transformation will occur in the SMA membrane, enabling a larger stroke to be achieved, as discussed above. Similarly, flux line 186d from permanent magnet 176b now couples magnetic flux from permanent magnet 176b into ferromagnetic mass 184b. A flux line 188 from electromagnet 180 now couples magnetic flux from the electromagnet into ferromagnetic mass 184b. If ferromagnetic mass 184b is coupled to an SMA membrane, the ferromagnetic mass and the SMA membrane would be attracted to permanent magnet 176b, and if the magnetic gradient and stress applied to the SMA membrane are sufficient, a phase transformation will occur in the SMA membrane, enabling a larger stroke to be achieved, as discussed above.

To achieve a yoke of a desired shape, iron powder can be cast, sintered, or cold pressed into the desired shape. Mixtures of powdered ferromagnetic metals and polymers can be combined and then sintered or cold pressed into the desired shape.

Referring once again to FIG. 6A, it should be noted that the relative polar orientations of the two different permanent magnets have a significant effect on the actuation cycle of an SMA membrane actuator. Consider hybrid magnetic trigger 172 implemented in the membrane actuator illustrated in FIG. 6B. Note that the relative polar orientations of the two different permanent magnets in hybrid magnetic trigger 172 are opposite. As shown in FIG. 6A, the north pole of permanent magnet 176a corresponds to the inner radial surface of permanent magnet 176a, and the north pole of permanent magnet 176b corresponds to the outer radial surface of permanent magnet 176b. It should be understood however, that the positions of permanent magnets 176a and 176b could be reversed without affecting the functionality of hybrid magnetic trigger 172. Based on this configuration of permanent magnets, when electromagnet 180 is energized, an enhanced magnetic flux will simultaneously be directed outwardly away from both permanent magnets (see FIG. 6C). Referring to FIG. 5B, this would mean that SMA membranes 22b and 22c will be actuated simultaneously. Significantly, if the electromagnet is energized using alternating current (A/C), then the enhanced magnetic flux will be present only during one half of the full A/C cycle, the half of the duty cycle where the direction of the magnetic flux provided by the electromagnet is opposite of the direction of the magnetic flux provided by the permanent magnet. When the direction of the magnetic flux provided by the electromagnet corresponds to the direction of the magnetic flux provided by the permanent magnet, then no "surge" of magnetic flux is directed outward and away from the permanent magnet.

However, if the relative polar orientations of both permanent magnets in a hybrid magnetic trigger 172a are identical, as indicated in FIG. 7A, and the electromagnet is energized using alternating current (A/C), then the enhanced magnetic flux will be present in each half of the full A/C cycle, and enhanced magnetic flux will be directed outwardly and away from one permanent magnet during each portion of the A/C cycle. That is, whenever the A/C current reverses direction, enhanced magnetic flux is directed outwardly and away from a different permanent magnet. However, the polar orientations of permanent magnet 176a and 176c of hybrid magnetic trigger 172a (FIG. 7A) are identical. Referring to FIG. 7B, flux line 186c is provided by permanent magnet 176a and is directed outwardly and away from permanent magnet 176a, because magnetic flux 188 provided by electromagnet 180 is in the opposite direction of the magnetic flux normally provided by permanent magnet 176a. Flux line 187 is provided by permanent magnet 176c and establishes a closed loop within yoke 178. Because the direction of flux line 187 (from permanent magnet 176c) corresponds to flux line 188 provided by the electromagnet (during this portion of the A/C cycle), no enhanced magnetic flux is emitted outwardly and away from permanent magnet 176c. When the A/C current reverses direction, then enhanced magnetic flux is emitted outwardly and away from permanent magnet 176c, but not from permanent magnet 176a. In this manner, during each half cycle of the A/C waveform, one permanent magnet in hybrid magnetic trigger 172a can be used to actuate an SMA membrane.

In the context of FIG. 5B, hybrid magnetic trigger 172 of FIG. 6A can be used to simultaneously actuate SMA membranes 22b and 22c every other cycle of an A/C source. In contrast, hybrid magnetic trigger 172a of FIG. 7B can be used to alternately actuate SMA membranes 22b and 22c, such that in one half of the A/C duty cycle, one of SMA membranes 22b and 22c is actuated, and in the other half of the A/C duty cycle, the other one of SMA membranes 22b and 22c is actuated. Thus, depending on the actuation sequence desired, hybrid magnetic trigger 172 or 172a can be implemented to achieve the desired actuation sequence.

Of course, for certain SMA membrane actuators, it may not be desirable for a single hybrid magnetic trigger to actuate two different SMA membranes. Referring now to FIG. 7C, a hybrid magnetic trigger 172b is configured with only a single permanent magnet, such that only a single SMA membrane will be actuated whenever the direction of the magnetic flux provided by permanent magnet 176a is opposite the direction of the magnetic flux provided by electromagnet 180. If the electromagnet is energized using A/C current, an enhanced magnetic flux will be directed outwardly away from permanent magnet 176a during only one half of the A/C duty cycle, as described above. If however, the electromagnet is energized using direct current (DC), and the direction of magnetic flux provided by the electromagnet is opposite to the direction of magnetic flux provided by permanent magnet 176a, then an enhanced magnetic flux will be directed outwardly away from permanent magnet 176a for as long as the electromagnet is energized. Of course, if the DC current provided establishes a magnetic flux having the same direction as the magnetic flux provided by permanent magnet 176a, then no enhanced magnetic flux will be directed outwardly away from permanent magnet 176a, unless the DC current provided is reversed so as to provide a magnetic flux in a direction opposing the magnetic flux provided by permanent magnet 176a.

FIG. 8A schematically illustrates a cross-sectional side view of an SMA membrane actuator constructed as a working prototype to verify the principles of the present invention. FIG. 8B is an image of that working prototype. The working prototype includes a hybrid magnetic trigger generally consistent with the hybrid magnetic triggers of FIGS. 6A and 7A, and an SMA membrane generally consistent with the SMA membrane of FIG. 5A. Referring to FIG. 8A, a hybrid magnetic trigger 70 is enclosed within a generally cylindrical housing. Hybrid magnetic trigger 70 includes permanent magnets 77 and 79 and electromagnet 75. As discussed in detail above, the polar orientations of permanent magnets 77 and 79 will determine whether hybrid magnetic trigger 70 is configured to simultaneously actuate SMA membranes disposed adjacent to the permanent magnets (see FIG. 5B), or to alternately actuate membranes disposed adjacent to the permanent magnets (see FIG. 5A). A generally cylindrical standoff 72 is used to position SMA membrane 74 relative to hybrid magnetic trigger 70. A ferromagnetic mass 76 is disposed on each side of SMA membrane 74, such that if a second hybrid magnetic trigger is disposed adjacent to the SMA membrane 74, then SMA membrane 74 can be actuated by the first or second hybrid magnetic trigger. Such a configuration is generally consistent with the SMA actuator schematically illustrated in FIG. 5A. A ring 80 is used to secure SMA membrane 74 to generally cylindrical standoff 72. In this prototype device, housing 70 is approximately 72 mm in diameter, and about 50 mm in height. A plurality of alignment rods 82, visible in the image of FIG. 8B, facilitate assembly of the SMA membrane actuator. Electrical conductors 84, used to couple hybrid magnetic trigger 70 to a power supply, are also visible in FIG. 8B. In the prototype device pictured in FIG. 8B, the ferromagnetic mass disposed furthest away from the hybrid magnetic trigger has been replaced by an aluminum ring 76a to facilitate fastening the ferromagnetic mass to the SMA. In a production model, aluminum ring 76a will be replaced by a ferromagnetic mass, to enable an additional hybrid magnetic trigger to be used to actuate the SMA membrane. Although no fluid inlet or outlet openings are shown in housing 70, as discussed above, fluid inlets and fluid outlets can readily be added as appropriate, to enable SMA membrane actuators in accord with the present invention to be incorporated into a plurality of different devices, including fluid pumps, suspension systems, and synthetic jet actuators.

FIG. 9A schematically illustrates the SMA membrane actuator of FIG. 8A, but with an additional hybrid magnetic trigger and SMA membrane. Thus, the SMA membrane actuator of FIG. 9A includes two hybrid magnetic triggers, each generally consistent with the hybrid magnetic triggers of FIGS. 6A and 7A, and two SMA membranes, each generally consistent with the SMA membrane of FIG. 5A. Clearly, additional SMA membranes and hybrid magnetic triggers can be similarly added to achieve a generally cylindrical SMA membrane actuator including a plurality of hybrid magnetic triggers and SMA membranes. FIG. 4C indicates that such a generally cylindrical SMA membrane actuator that includes a plurality of elements can be beneficially incorporated into the wing of an aircraft, to advantageously modify airflow over the wing. Thus, the SMA membrane actuator of FIG. 9A is particularly well-suited for producing synthetic jets for use in aircraft wings. An additional generally cylindrical standoff 72 is incorporated into the SMA membrane actuator of FIG. 9A, to insure that SMA membrane 74b is properly positioned relative to hybrid magnetic trigger 70a and hybrid magnetic trigger 70b. FIG. 9B is an overall image of that working prototype. The overall dimensions of the prototype device shown in FIG. 9B are approximately 72 mm in diameter and 125 mm in height. Note that SMA membrane 74b includes a ferromagnetic mass disposed on either side of the SMA membrane, so that the SMA membrane can be actuated by either hybrid magnetic trigger 70a or hybrid magnetic trigger 70b. As discussed in detail above, the relative polar configurations of the permanent magnets in hybrid magnetic trigger 70a will determine whether SMA membranes 74a and 74b will be actuated simultaneously or alternately.

In the prototype device of FIGS. 8B and 9B, the connection between the NiTi plate and the soft iron pad was established using several threaded fasteners, with reinforcement provided by an aluminum ring on the opposite side of the plate. Both the ferromagnetic mass and the yoke in the hybrid magnetic trigger were made of low carbon steel.

FIG. 10A schematically illustrates a drive circuit that can be used to control hybrid magnetic trigger 70a and hybrid magnetic trigger 70b in the SMA membrane actuator of FIGS. 9A and 9B. An input signal 85 is received by waveform generator 87, which separates the input signal into two output signals 89 and 91. If required, signal amplifiers 93 are used to increase the amplitude of output signals 89 and 91, such that the output signals can be used to drivingly energize hybrid magnetic triggers 70a and 70b, respectively. This drive circuit enables hybrid magnetic trigger 70a and hybrid magnetic trigger 70b to be energized individually in a synchronized fashion.

FIGS. 10B and 10C are based on FIG. 9A, but incorporate an additional hybrid magnetic trigger 70c. Using the drive circuit of FIG. 10A enables hybrid magnetic triggers 70a-70c to be synchronized using a single input signal (hybrid magnetic trigger 70a and 70c are both triggered using output signal 89). Those of ordinary skill in the art will appreciate that additional SMA membranes and hybrid magnetic triggers can be added, such that each new hybrid magnetic trigger is driven using either output signal 89 or output signal 91, and such that every other hybrid magnetic trigger is driven by either output signal 89 or output signal 91. In FIG. 10B, output signal 89 is used to energize the electromagnets in hybrid magnetic triggers 70a and 70c, such that enhanced magnetic flux is directed outwardly and away from each permanent magnet in hybrid magnetic triggers 70a and 70c. This effect is consistent with the magnetic flux illustrated in FIG. 6C. SMA membrane 74a is attracted to permanent magnet 77a, while SMA membrane 74b is attracted to permanent magnet 79c, as indicated by arrows 83. Note that the permanent magnets experiencing such enhanced magnetic flux are encompassed in an ellipse formed using dashed lines. Movement of the SMA membranes results in a displacement of fluid from the housing enclosing the hybrid magnetic triggers and SMA membranes, as indicated by arrows 81. As discussed in detail above, the number and orientation of openings in the housing will determine whether the movement of fluid will result in the generation of a synthetic jet, the pumping of a fluid, or the dampening of a vibration.

In FIG. 10C, output signal 91 is used to energize the electromagnet in hybrid magnetic trigger 70b, such that enhanced magnetic flux is directed outwardly and away from permanent magnets 77b and 79b in hybrid magnetic trigger 70b. Again, this effect is consistent with the magnetic flux illustrated in FIG. 6C. SMA membrane 74a is attracted to permanent magnet 79b, while SMA membrane 74b is attracted to permanent magnet 77b, as indicated by arrows 83. Again, movement of the SMA membranes results in a displacement of fluid, as indicated by arrows 81. Because output signal 89 and output signal 91 are synchronized, SMA membranes 74a and 74b will reciprocate back and forth between the hybrid magnetic triggers disposed on either side of the SMA membranes.

It should be recognized that the actuation sequence described in connection with FIGS. 10A-10C is not the only possible actuation sequence, but rather an exemplary actuation sequence, and that the actuation sequence corresponding to FIGS. 10A-10C is not intended to limit the scope of this invention. FIGS. 10D and 10E schematically illustrate an alternative actuation sequence, using the hybrid magnetic triggers and the SMA membranes illustrated in FIGS. 10A-10C. In this actuation sequence, all of the hybrid magnetic triggers are energized at the same time, but each hybrid magnetic trigger has been configured such that the enhanced magnetic flux is emitted outwardly and away from the permanent magnets associated with the hybrid magnetic triggers in an alternating fashion, consistent with the flux patterns discussed in detail in regard to FIG. 7B. As discussed above, such an alternating actuation sequence can be achieved by manipulating the polar configurations of the permanent magnets in the hybrid magnetic triggers. As schematically illustrated in FIG. 10D, the permanent magnets on the right side of each hybrid magnetic trigger (permanent magnets 77a, 77b, and 77c) emit an enhanced magnetic flux in a first portion of the actuation sequence, then the permanent magnets on the left side of each hybrid magnetic trigger (permanent magnets 79a, 79b, and 79c) emit an enhanced magnetic flux in a second portion of the actuation sequence, as schematically illustrated in FIG. 10E. Such an actuation sequence results in SMA membranes 74a and 74b reciprocating back-and-forth between the adjacent hybrid magnetic triggers. The waveform generator of FIG. 10A is not required for this actuation sequence, because the cyclical reversing of the A/C current direction automatically results in the enhanced magnetic flux alternating between the different permanent magnets in each hybrid magnetic trigger.

FIG. 11 schematically illustrates the dimensions of the SMA membrane implemented in the prototype device. SMA membrane 74 is formed using a NiTi plate approximately 64 mm in diameter and approximately 0.33 mm in thickness. Ferromagnetic mass 76 is implemented using a soft iron pad approximately 33 mm in diameter and approximately 5 mm in thickness.

FIG. 12 is a schematic illustration of yet another exemplary SMA membrane, and includes a representation of the deformation experienced by an exemplary SMA membrane. It should be noted that the exemplary SMA membrane appears particularly well-suited for use in SMA membrane actuators configured to produce synthetic jets. Referring to FIG. 12, r1=32 mm; r2=16.5 mm, and h=4 mm. When used to produce a synthetic jet, the jet velocity v can be estimated using the following relationship:

$$\Delta V \times f = v \times (W \times L)$$

where v is the jet velocity, f is the frequency of vibration of the SMA membrane, W is the width of the fluid opening through which the synthetic jet is released, and L is the length of the fluid opening through which the synthetic jet is released. When the exemplary SMA membrane is vibrated at a frequency of 146 Hz, and the dimensions of the fluid opening are W=1 mm and L=40 mm, the resulting jet velocity is about 30 meters/second. If the SMA membrane is further driven into the super elastic range, a jet velocity of up to 100 meters/second is theoretically achievable.

FIG. 13A graphically illustrates a force and displacement relationship for the SMA diaphragm implemented in the working prototype models of FIGS. 8B and 9B, based on quasi-static operation. A force of approximately 200 N is required to displace the SMA membrane by approximately 2 mm. At that point, the onset of martensitic transformation has been reached, and the SMA material become softer, enabling more displacement to be achieved per unit of additional force applied.

FIG. 13B graphically illustrates the displacement of the exemplary SMA diaphragm utilized in the working models of FIGS. 8B and 9B, again based on quasi-static operation. While the electromagnet is not being energized, the SMA membrane experiences substantially no displacement (the small amount of displacement is due to the attraction of the ferromagnetic mass coupled to the SMA membrane by the permanent magnet portion of the hybrid magnetic trigger). Once the electromagnet has been energized, the SMA membrane is displaced with the stroke of approximately 2 mm. Because the SMA membrane is disk-shaped, and the ferromagnetic mass is disposed at the center of the disk, the center portion of the SMA membrane experiences the greatest displacement. FIG. 13C graphically illustrates a predicted frequency response for the SMA diaphragm of FIG. 12, substantiating the ability of the exemplary SMA membrane to achieve the 146 Hz frequency discussed above.

The following observations were made in investigating the empirical designs above, particular with respect to utilizing SMA membrane actuators for the generation of synthetic jets, and the other uses discussed above. To optimize the stroke of the SMA membrane, it should oscillate close to its resonance frequency. The closer to the resonance frequency, the larger will be the stroke of the vibration, which can create larger volume changes in each membrane chamber, and which will induce higher momentum in the synthetic jet fluid. However, the larger stroke will also induce greater stress on the diaphragm. Using a super-elastic NiTi plate for the diaphragm is particularly preferred, because NiTi can sustain high stress levels without permanent deformation, and because a larger stroke can be obtained when the stress level on the diaphragm is over the pseudo-yield stress of the super elasticity (i.e., a larger stroke can be obtained when a martensitic transformation is induced). Driving the membrane to close to its resonance frequency will not only optimize the stroke, but will also increase the energy efficiency of the actuator system, so that the power consumed by the actuator can be reduced as compared to quasi-static operation.

A dynamic analysis of the exemplary SMA membrane of FIG. 12 was performed using finite element (FEM) analysis based on a ¼ diaphragm FEM model, shown in FIG. 13C. Due to limitations of the FEM program employed, it was not possible to perform frequency response calculations including the non-linear stress-strain super elasticity relationship, and the FEM analysis is only valid before the stress-induced martensitic transformation (at about 380 MPa) on the NiTi plate. The Young's modulus of 70 GPa, a Poisson ratio of 0.33, and a density of 6500 Kg/m$^3$ were used as input data for the NiTi plate. The Young's modulus of 210 GPa, Poisson ratio of 0.33, and a density of 7850 Kg/m$^3$ were used for the soft iron pad. The boundary condition at the gripping portion was assumed to be without slip and rotation.

FIG. 13D graphically illustrates the resonance frequency as a function of NiTi plate thickness, where the SMA diaphragm has the same dimensions as in FIG. 12, except for the plate thickness (which varies in FIG. 13D). This relationship clearly shows that the thicker the plate, the higher will be the resonance frequency. The thickness of the soft iron pad (i.e., the ferromagnetic mass) also can affect the resonance frequency of the SMA diaphragm when the ferromagnetic mass is attached to the SMA diaphragm.

FIG. 13E graphically illustrates that as the thickness of the soft iron pad increases, the resonance frequency of the SMA diaphragm to which it is attached decreases. FIG. 13D indicates that an SMA membrane of about 0.33 mm in thickness will have a resonance frequency of about 150 Hz, and FIG. 13E indicates that a ferromagnetic mass of about 5 mm in thickness will have a resonance frequency of about 130 Hz. Therefore, in order for the SMA diaphragm to be driven close to its resonance frequency, to obtain a larger stroke, it would be preferable to drive the SMA diaphragm at about 150 Hz.

Based on the FEM analysis, the stroke on the center of the diaphragm as a function of frequency relationship is shown in FIG. 13F. The stroke will significantly increase as the frequency approaches about 150 Hz, where the resonance frequency of the diaphragm is around 151 Hz. As noted above, the FEM analysis was not capable of accommodating the non-linear stress-strain curve of the super elastic NiTi plate. Therefore, the analysis is only approximate. However, the analysis results are still valid before the stress-induced martensitic transformation.

FIG. 13G shows the stress level on several locations of the diaphragm as a function of frequency. The highest stress level occurs on both locations of the gripping portion and the interface between the NiTi plate and the soft iron pad as shown FIG. 13G. The arrow indicates the onset of the stress induced martensitic transformation, where FEM analysis is still valid. The onset is at about 380 MPa, when the frequency is about 145 Hz, and the stroke of the diaphragm is about 4 mm (the stroke is about 8 mm peak-to-peak). This result indicates that when the stress-induced martensitic transformation occurs, more stroke can obtained from the SMA diaphragm, because the stiffness of the NiTi plate decreases due to the phase transformation.

An empirical testing system included two function generators, a power supply, an amplifier and a laser displacement measurement system. The amplifier provided two square wave signals (as indicated in FIG. 10A) for two hybrid magnet systems. The magnitude of the square wave signal was between 0 V and 20 V. A square wave signal can reduce energy consumption when using hybrid magnet triggers that only operate for one direction of the electrical current flow. The function generators control the frequency of signals and their signal phases. The laser displacement measurement system was used to control the position of the laser device along the diameter of the diaphragm, so that the profile of the diaphragm is detected. The profile empirically identified is shown in FIG. 13B and can be used to calculate how much volume change occurs due to deformation of the SMA diaphragm. Both quasi-static and dynamic tests of the membrane actuator system were performed.

The quasi-static test of the membrane actuator was performed with one hybrid magnet and a maximum input current of about 3 Amp for the system. Quasi-static operation refers to operating the actuator slowly, with a frequency well below the resonance frequency. Quasi-static operation can induce stress-induced martensitic transformation if the input power is large enough to produce a large force on the diaphragm. However, quasi-static operation consumes significant power, much more than is required to drive the actuator close to its resonance frequency. FIGS. 13F and 13G illustrate this point. The profile across the diameter of the FSMA composite diaphragm was then detected by the laser measurement system, as indicated in FIG. 13B. This test result indicates that the hybrid magnet trigger energized with 3 Amps of current is powerful enough to deform the exemplary SMA diaphragm. The SMA diaphragm has about a 2 mm displacement when the hybrid magnet system is energized. When the power is off, the SMA diaphragm springs back due to the super elastic property of the NiTi shape memory alloy plate. If a higher current input is available, a greater force can be induced by the hybrid magnet system, and more deformation of the composite diaphragm will occur.

The dynamic performance on the empirical diaphragm actuator (FIGS. 8B and 9B) was tested as well. Due to the structure of the membrane actuator, the stroke of the composite diaphragm cannot be detected by laser measurement. Nevertheless, the stroke still can be detected by a CCD camera. Two square wave signals of 20 V amplitude were generated by the function generators and the amplifier. When the signal frequency was 20 Hz, a 4 mm peak-to-peak stroke of the composite diaphragm was detected. However, the composite diaphragm inclined to one side of the hybrid magnetic trigger, and the stroke did not increase with an increase in both the signal frequency and the voltage. This result is due to the substantial eddy currents induced in the yoke of the hybrid magnet system, which cause energy loss and reduce the actuator efficiency. The presence of such eddy currents was evidenced by heating of the center of the yoke of the hybrid magnetic trigger during the testing procedure. Minimizing eddy currents will likely enable more efficient hybrid magnetic triggers to be built.

The eddy currents in the hybrid magnetic trigger used in the prototype devices illustrated in FIGS. 8B and 9B were measured using a teslameter, as a function of frequency. Measurements were also made for a coil alone, and a coil with a center yoke. The results indicate a slight drop in magnetic field in the coil alone when the frequency is over 20 Hz, while the magnetic fields of center yoke/coil and the hybrid magnetic trigger decline significantly. When the frequency is 80 Hz, the magnetic fields are almost the same for the three cases. This result means that the eddy-current effect at higher frequencies is too great to let the magnetic flux flow through the yoke. A further problem identified at higher frequencies (i.e. at 80 Hz) is that the magnetic field does not reset to zero when the current signal is zero. This means the hybrid magnetic trigger will always be exerting some force on the SMA membrane, and the SMA membrane will not return to its neutral position. The empirical studies have indicated that reducing the turns of the coil in the hybrid magnetic trigger may lead to an increase in efficiency, because the magnetic field produced by a coil slightly decreases when the signal frequency is 80 Hz. To increase the efficiency of the hybrid magnetic trigger at higher frequencies, eddy currents can be reduced by using a laminated yoke in a plane perpendicular to the direction of the eddy currents, and small-distributed coils.

It should be understood that the present invention is not limited to the specific hybrid magnet trigger embodiments discussed above in detail. Those of ordinary skill in the art will appreciate the many other hybrid magnet trigger designs are possible. An important element in hybrid magnet trigger design is an understanding of the flow of magnetic flux in the hybrid magnetic trigger, both while the electromagnet is not energized, and while it is. When the direction of the magnetic flux provided by a permanent magnet opposes the direction of magnetic flux provided by the electromagnet, an enhanced magnetic flux will be emitted outwardly and away from the permanent magnet. Based on that understanding, the polar orientation of permanent magnets can be selected such that the hybrid magnetic trigger is capable of simultaneously or alternately actuating SMA membranes disposed adjacent to the permanent magnets. Different hybrid magnetic trigger designs can be investigated, with the goal of developing hybrid magnetic triggers capable of exerting larger forces on the SMA membranes, while using energy as efficiently as possible.

FIGS. 14A-14E schematically illustrate designs for hybrid magnetic triggers investigated to address the eddy current problem note above. Each of these designs has been empirically investigated to determine the amount of flux produced when the electromagnet portion of the hybrid magnetic trigger is energized. FIG. 15 graphically illustrates force and frequency relationships empirically determined for the hybrid magnetic trigger designs of FIGS. 14A-14E, indicating that the design corresponding to FIG. 14A is capable of producing the greatest magnetic force.

FIGS. 14A-14D schematically illustrate hybrid magnetic triggers including small distributed coils. The yoke and the armature are preferably laminated. The five coils are electrically connected in parallel, but magnetically connected in series along the yoke. The input voltage (peak-to-peak) during measurement was about 34 V. As indicated in FIG. 15, hybrid magnetic triggers with small-distributed coils and a laminated yoke have better frequency response and larger magnetic fields than were obtained with the hybrid magnetic trigger used in the prototype devices of FIGS. 8B and 9B (i.e., FIG. 14E). This indicates that improved hybrid magnetic triggers can be used to achieve higher frequencies, and therefore larger SMA membrane actuator strokes, which in turn will enable the production of a synthetic jet with higher fluid momentum.

Hybrid magnetic trigger 130a of FIG. 14A includes a laminated yoke 132, a permanent magnet 136, and an electromagnet made up of five separate coils 134. The magnetic field strength achieved by hybrid magnetic trigger 130a when coils 134 were energized was measured using a probe 138. A laminated armature 140 was disposed proximate to the probe to determine the effect the armature has on the magnetic field strength.

Hybrid magnetic trigger 130b of FIG. 14B includes laminated yoke 132, a plastic mass 142 in place of permanent magnet 136, and an electromagnet comprising five separate coils 134. The magnetic field strength achieved by hybrid magnetic trigger 130b when coils 134 were energized was measured using probe 138, without use of an armature.

Hybrid magnetic trigger 130c of FIG. 14C includes laminated yoke 132, permanent magnet 136, and an electromagnet comprising five separate coils 134. The magnetic field strength achieved by hybrid magnetic trigger 130a when coils 134 were energized was measured using a probe 138, without an armature.

Hybrid magnetic trigger 130d of FIG. 14D includes laminated yoke 132, plastic mass 142 in place of permanent magnet 136, and an electromagnet comprising five separate coils 134. The magnetic field strength achieved by hybrid magnetic trigger 130d when coils 134 were energized was measured using a probe 138. A laminated armature 140 was disposed proximate to the probe to determine the effect of the armature on the magnetic field strength.

Hybrid magnetic trigger 130e of FIG. 14E includes yoke 132, a permanent magnet 136, and an electromagnet including one large coil 144. The magnetic field strength achieved by hybrid magnetic trigger 130e when coil 144 was energized was measured using a probe 138, without an armature.

FIG. 16 graphically illustrates a predicted force and displacement relationship based on using the exemplary SMA diaphragm of FIG. 12 in the SMA membrane actuators of FIGS. 5A and 5B. A line 104 corresponds to the SMA membrane actuator of FIG. 5B, and a line 106 corresponds to the SMA membrane actuator of FIG. 5A.

FIG. 17A schematically illustrates another embodiment of an SMA diaphragm actuator, which includes a single hybrid magnetic trigger and a pair of SMA diaphragms, generally consistent with the SMA membrane actuator discussed above in connection with FIG. 5B. Hybrid magnetic trigger 92 is disposed in a generally cylindrical housing 90. Hybrid magnetic trigger 92 includes electromagnet 96, a pair of ring shaped permanent magnets 98a and 98b, and a yoke 94, is generally cylindrical shaped, just as the hybrid magnetic triggers of the FIGS. 6A and 7A, and has an axial volume 99. Significantly, the permanent magnets of hybrid magnetic trigger 92 are disposed adjacent to axial volume 99, rather than on upper and lower surfaces, as with the hybrid magnetic triggers of FIGS. 6A and 7A. Another difference between the permanent magnets in hybrid magnetic trigger 92 and the hybrid magnetic triggers of FIGS. 6A and 7A is that the polar orientation of the permanent magnets in the hybrid magnetic triggers of FIGS. 6A and 7A is along the radial surfaces of the permanent magnets. In contrast, the polar orientation of the permanent magnets in hybrid magnetic trigger 92 is along the upper and lower surfaces of the permanent magnets.

An upper opening in generally cylindrical housing 90 is sealed by SMA membrane 84a, and a lower opening in generally cylindrical housing 90 is sealed by SMA membrane 84b. A ferromagnetic mass 86a is coupled to SMA membrane 84a, and a ferromagnetic mass 86b is coupled to SMA membrane 84b. Each ferromagnetic mass extends into axial volume 99, such that each ferromagnetic mass is disposed adjacent to one of the permanent magnets in hybrid magnetic trigger 92. Thus, ferromagnetic mass 86a is disposed generally adjacent to permanent magnet 98a, and ferromagnetic mass 86b is disposed of generally adjacent to permanent magnet 98b. If desired, a spacer 88 can be used to couple the ferromagnetic masses to the SMA membranes and can be made from a lightweight material, such as a plastic, to reduce the mass of the device. Alternatively, the spacer can be eliminated, and the ferromagnetic masses can be coupled directly to the SMA membranes. In an exemplary device, mechanical fasteners were used to couple the ferromagnetic masses to the SMA membranes. Those of ordinary skill in the art will understand that many different fastening mechanisms can be used to couple a ferromagnetic mass to an SMA membrane, including but not limited to, suitable adhesives, mechanical fasteners, soldered coupling, and welding coupling.

FIG. 17B illustrates one potential actuation sequence for the SMA diaphragm actuator of FIG. 17A. When electromagnet 96 is energized, an enhanced magnetic flux is directed outwardly and away from permanent magnets 98a and 98b. Ferromagnetic mass 86a is attracted to permanent magnet 98a, and ferromagnetic mass 86b is similarly attracted to permanent magnet 98b, resulting in the simultaneous deformations of SMA membranes 84a and 84b. Energizing electromagnet 96 with an AC signal will result in the SMA membranes reciprocating back and forth between the deformed position (shown in FIG. 17B) and the rest position (shown in FIG. 17A).

As discussed in detail above, the relative polar orientations of the permanent magnets determines whether SMA membranes 84a and 84b are actuated simultaneously or alternately. FIG. 18A schematically illustrates a polar configuration for permanent magnet 98a, and FIGS. 18B and 18C each schematically illustrate different polar configurations for permanent magnet 98b. When hybrid magnetic trigger 92 is implemented using the polar configurations of FIGS. 18A and 18B, then each SMA is actuated simultaneously. When hybrid magnetic trigger 92 is implemented using the polar configurations of FIGS. 18A and 18C, then each SMA is actuated alternately (actuating both SMA membranes will require reversing the current direction, as described above).

FIG. 19A is a plan view of yet another embodiment of a hybrid magnetic trigger. Initial studies indicate that this design may be more efficient than those discussed above. Hybrid magnetic trigger 150 includes a yoke 156, a pair of coils 152 of substantially equal size, and a third coil 153 centrally disposed in yoke 156 (coils 152 and coil 153 comprise the electromagnet). Two bar magnets 154 are disposed on the upper surface of yoke 156.

FIG. 19B is a cross-sectional view, while FIG. 19C is a side elevational view of hybrid magnetic trigger 150. As indicated in these Figures, hybrid magnetic trigger 150 is about 55 mm in height, about 55 mm in width, and about 25 mm in depth. FIG. 19D is a cross-sectional view of a synthetic jet actuator including SMA membrane 74 disposed between hybrid magnetic trigger 150a and 150b (each of hybrid magnetic trigger 150a and 150b are generally consistent with hybrid magnetic trigger 150 discussed above). SMA membrane 74 includes ferromagnetic masses 76 disposed on the upper and lower surfaces of the membrane, enabling the SMA membrane to be actuated from either surface. The SMA membrane and hybrid magnetic triggers are disposed in a housing 158. Although openings in the housing are not shown, as discussed in detail above, openings can be formed into the housing based on the intended use of the SMA membrane actuators (i.e., for the generation of a synthetic jet, for use as a pump, or for use in a suspension system). Also as noted above, the specific dimensions of fluid openings are particularly important where the SMA membrane actuators are used to generate a synthetic jet. The drive unit of FIG. 10A can be used to manipulate an input signal to generate two synchronized output signals to actuate hybrid magnetic triggers 150a and 150b alternately, thereby causing SMA membrane 74 to reciprocate back and forth.

Based on the empirical studies discussed above, an improved SMA membrane actuator was developed. The improved actuator includes a modified SMA membrane and a modified hybrid magnetic trigger, and empirical testing has established that the modified design enables a synthetic velocity of 190 meters/second to be achieved at 220 Hz, compared with a synthetic jet velocity of 30 meters/second at 146 Hz that was achieved using the SMA membrane of FIG. 12 and the hybrid magnetic trigger of FIG. 6A. The improved composite diaphragm oscillates at a higher frequency, driven by a hybrid magnetic trigger design that does not suffer from the eddy current problem noted above. The composite diaphragm experiences the stress-induced martensitic phase transformation produced by the applied magnetic field gradient, thus enhancing the stroke and producing a relatively high synthetic jet velocity. The term "composite diaphragm" refers to the combination of an SMA membrane coupled to a ferromagnetic mass. As noted above, a plurality of SMA membrane actuators can be assembled in series, and thus employed for distributing the synthetic jet flow along the wing span. The improved actuator develops a higher synthetic jet velocity, and is therefore particularly well suited for such applications.

FIG. 20A is a ANSYS model of an improved composite diaphragm 200, developed using ANSYS FEM. FIG. 20B is a schematic side view of improved composite diaphragm 200. An SMA membrane 202 is preferably implemented as a NiTi plate. Significantly, ferromagnetic masses 206a and 206b (preferably soft iron pads) are square in order to obtain the maximum force possible from the hybrid magnetic trigger (which uses bar magnets instead of ring magnets for the permanent magnets). Two spacers are used to separate the soft iron pad and the NiTi plate, as clearly indicated in FIG. 20B. A spacer 204 is a solid circular steel plate and has been included to add rigidity to composite diaphragm 200, and to ensure uniform stress distribution along the circumference of SMA membrane 202. Spacer 204 can also be used to adjust the resonance frequency of the composite diaphragm. The dimension and weight of spacer 204 affects the stiffness and mass of composite diaphragm 200. A spacer 205 is preferably made of aluminum and is included to prevent contact between the soft iron pad (ferromagnetic masses 206a and 206b) and the NiTi plate (SMA membrane 202) during oscillation of the composite diaphragm.

During the ANSYS FEM, a Young's modulus of 55 GPa, a Poisson ratio of 0.33, and a density of 6500 Kg/m3 were used as input data for the NiTi plate (SMA membrane 202). A Young's modulus of 210 GPa, a Poisson ratio of 0.33, and a density of 7850 Kg/m3 were used for the soft iron pads (ferromagnetic masses 206a and 206b). A Young's modulus of 70 GPa, a Poisson ratio of 0.33, and a density of 2700 Kg/m3 were used for the aluminum pad (spacer 205). In the simulation, the boundary condition of the NiTi diaphragm was assumed to be totally constrained without rotation and slipping on its own diameter, circumference and the interface with the circumference of spacer 204. As discussed above, limitations in the ANSYS FEM program only enable frequency response calculations to be performed with a linear Young's modulus, and thus, the frequency response calculations are not valid beyond the point of stress-induced martensitic transformation (at about 450 MPa). However, this analysis still provides useful results with respect to possible driving frequencies.

The NiTi plate is about 64 mm in diameter, and the soft iron pads (ferromagnetic masses 206a and 206b) are about 32 mm×30 mm×3 mm. Spacer 204 is about 33 mm in diameter and about 1 mm in thickness, and spacer 205 is about 30 mm in diameter and about 2 mm in thickness. FIG. 21A graphically illustrates the ANSYS FEM results for the resonance frequency of the composite diaphragm as a function of the thickness of the NiTi plate (SMA membrane 202), and clearly indicates that thicker diaphragms yield higher resonance frequencies.

FIG. 21B graphically illustrates the ANSYS FEM results for the resonance frequency of the composite diaphragm as a function of the thickness of the soft iron pads (ferromagnetic masses 206a and 206b), and clearly indicates that the thickness of the soft iron pads (ferromagnetic masses 206a and 206b) also can affect the resonance frequency of the entire composite diaphragm structure, as well as affecting the force induced by the hybrid magnetic trigger. Generally, the greater the volume of the ferromagnetic mass, the stronger the force produced. FIG. 21B, which is based on use of an SMA membrane 202 about 0.3 mm thick, indicates that use of thicker soft iron pads will reduce the resonance frequency of the composite diaphragm, but will enable a greater force to be obtained.

These data enable a hybrid magnetic trigger to be developed whose frequency response is well matched to the mechanical frequency response of composite diaphragm 200. The ANSYS FEM results also suggest that the highest stress level occurs on the diameter circumference and the interface between the NiTi plate and the pad. In order to obtain as great a stroke as possible (and thus achieve the highest synthetic jet velocity), it is important that the stress level induced on SMA membrane 202 be sufficient to induce stress-induced martensitic transformation.

A more preferred hybrid magnetic trigger 208 is schematically illustrated in FIG. 22A. Hybrid magnetic trigger 208 includes a yoke 210, a pair of coils 212a and 212b, and a pair of permanent magnets 214a and 214b. Preferably yoke 210 is implemented as a laminate of grain-oriented Fe—Si sheets (about 0.15 mm thick). Permanent magnets 214a and 214b are polarized opposite to each other, and are Neodymium based. As shown in FIG. 22B, when the electromagnet is off (i.e., when hybrid magnetic trigger 208 is not energized), permanent magnet 214a produces a clockwise magnetic flux loop (as indicated by arrow 216a), and permanent magnet 214b produces a counter-clockwise magnetic flux loop (as indicated by arrow 216b). Both flux loops are closed loops within the yoke, and little magnetic flux enters the soft iron pad (ferromagnetic mass 206a, which is coupled to SMA membrane 202) when hybrid magnetic trigger 208 is not energized. Therefore, no force is exerted on the composite diaphragm, if hybrid magnetic trigger 208 is not energized.

When hybrid magnetic trigger 208 is energized, the magnetic flux lines are reversed, as indicated by arrows 216c and 216d in FIG. 22C. The magnetic field flux will "punch out" of the yoke proximate the permanent magnets and exert a force on the adjacent soft iron pad (ferromagnetic mass 206a), producing a high force pulling on the composite diaphragm (and SMA membrane 202) due to a locally high magnetic field gradient. To ensure the high frequency response (200~300 Hz), and to increase the efficiency of the hybrid magnetic trigger, a laminated yoke made of grain-oriented Fe—Si sheets is used in hybrid magnetic trigger 208, as noted above. Such a laminated yoke significantly reduces the energy loss due to the eddy current effect exhibited in the hybrid magnetic triggers described above, and enables stronger magnetic field gradients to be produced.

In order to obtain a fast frequency response and a strong magnetic flux gradient, the two electrical coils are coupled in parallel electrically, but coupled in series magnetically. FIG. 22D shows the magnetic field response of hybrid magnetic trigger 208 as a function of frequency, based on use of 100 turn coils (indicated by solid lines) or on use of 300 turn coil (indicated by dashed lines).

FIG. 23 is an image of composite diaphragm actuator 220 fabricated using one composite diaphragm 200 (FIGS. 20A and B) and two hybrid magnetic triggers 208a and 208b, each generally consistent with hybrid magnetic triggers 208 of FIGS. 22A, 22B, and 22C. The overall dimensions of diaphragm actuator 220 actuator are about 72 mm×85.6 mm×130 mm, with a total weight of about 1.36 Kg. Composite diaphragm actuator 220 includes a generally cylindrical housing 226 disposed between hybrid magnetic triggers 208a and 208b. Composite diaphragm 200 (see FIGS. 20A and 20B) separates cylindrical housing 226 into two fluidically isolated chambers 222a and 222b (see FIG. 9B and SMA membrane 74a for a similar configuration). Each chamber includes a generally rectangular orifice 224 having dimensions of 5 mm×1 mm, that serve as the exit for the synthetic jet flow (note that when the motion of composite diaphragm 200 causes the volume of a chamber to increase, ambient fluid will be drawn into the chamber through orifice 224, and when the motion of composite diaphragm 200 causes the volume of the chamber to decrease, fluid within the chamber will be emitted via orifice 224).

Composite diaphragm 200 was fabricated by cutting a 0.3 mm thick sheet of super-elastic NiTi into a 72 mm diameter circular diaphragm using an EDM machine. The 72 mm diameter circular diaphragm was then clamped between two aluminum rings (each of which forms generally cylindrical housing 226), each aluminum ring having a width of 4 mm, thereby achieving SMA membrane 202, with an effective diameter of 64 mm. The soft iron pads (ferromagnetic masses 206a and 206b) and spacer 204 were fabricated from a 1018 low carbon steel. The dimensions of the soft iron pads are about 30 mm×32 mm×3 mm, and spacer 204 is about 33 mm in diameter and 1 mm in thickness. Spacer 205 is about 32 mm in diameter and about 2 mm in thickness. The finite element analysis discussed above indicates that composite diaphragm 200 has a resonance frequency of about 180 Hz. In the empirical model of composite diaphragm 200, the aluminum rings are attached to the SMA plate with threaded fasteners. Gaskets and silicon are applied to ensure a tight seal of the chambers.

Composite diaphragm actuator 220 can be controlled using a system similar to that schematically illustrated in FIG. 10A. The input signals for hybrid magnetic triggers 208a and 208b are square wave signals with a 180° phase difference (see input signals 89 and 91 in FIG. 10A). It should be noted that a complex controller is not required, and that the driver circuit used to empirically test composite diaphragm actuator 220 was based on a commercially available controller for stepping motor.

Each hybrid magnetic trigger used in composite diaphragm actuator 220 includes a laminated yoke, two electrical coils and two permanent magnets, generally as described above in connection with FIG. 22A. The laminated yoke substantially eliminates the eddy current problem for frequencies up to about 400 Hz.

The synthetic jet flow velocity produced by composite diaphragm actuator 220 was empirically determined using a hotwire test method (TSI IFA 100 with a platinum hot film probe). The platinum probe was carefully positioned immediately adjacent to one of orifices 224, parallel with the length of the orifice. FIG. 24A graphically illustrates measured synthetic jet flow velocities as a function of frequency based on the use of composite diaphragm 200 (including the 0.3 mm thick NiTi plate). The relationship indicated in FIG. 24A shows that the synthetic jet velocity increases as the frequency increases, and has a peak velocity of 190 meters/second at 220 Hz.

The design concept of the SMA membrane actuators of the present invention takes advantage of the hybrid mechanism for inducing phase transformation and SMA materials. The hybrid mechanism refers to stress-induced martensitic phase transformation caused by a large force produced in response to a large magnetic field gradient, thus enhancing the displacement, as the stiffness of shape memory alloy decreases as a result of the martensitic transformation. Thus, one important design criteria is understanding the stress level experienced by the SMA membrane. The greater the portion of the displacement of the SMA membrane that is due to the martensitic transformation, the larger will be the volume change in the chamber in which the SMA membrane is disposed. Larger volume changes result in higher synthetic jet velocities. Due to geometric limitations, a standard measurement of the dynamic frequency response of composite diaphragm actuator 220 was not possible. Thus, the displacement-frequency response was measured by a high-speed video camera system, and the results are graphically illustrated in FIG. 24B. The stroke reaches a maximum of 1.86 mm at a frequency of 195 Hz, which is lower than the peak frequency of 220 Hz indicated in FIG. 24A. This difference is likely due to different levels of air compression inside the chamber.

Based on the theory of plates and shells, the maximum stress and the maximum displacement can be estimated by:

$$\sigma_{max} = k\frac{P}{h^2}$$

$$w_{max} = k_1 \frac{Pa^2}{Eh^3}$$

where P is the load on the diaphragm, h is the thickness of the diaphragm, a is radius of the diaphragm, w is stroke experienced by the diaphragm, and E is the Young's modulus of the diaphragm material. The displacement of the composite plate before the onset of, martensitic phase transformation on the NiTi diaphragm can be estimated. For the case where the SMA diaphragm is made from a 0.3 mm thick sheet of NiTi, when the stroke reaches 1.5 mm, the NiTi diaphragm is at the onset of martensitic transformation (450 MPa), as indicated in FIG. 24C. In addition, the FEM results discussed above indicate that the maximum stress reaches 510 MPa when the stroke of the composite diaphragm is 1.86 mm at 190 Hz, as indicated in FIG. 24B. Therefore, the SMA diaphragm induces a strong synthetic jet flow when it reaches the stress-induced martensitic transformation. However, the membrane actuator can produce a stronger synthetic jet if more martensitic transformation in induced on the SMA diaphragm. Based on empirical testing of composite diaphragm actuator 220, the performance of composite diaphragm actuator 220 can be calculated in terms energy density (ED), power density (PD) and specific efficiency (SE), using the following relationships:

$$ED = \frac{work}{V}$$

$$PD = ED \times frequency$$

$$SE = \frac{work \times frequency}{inputpower \times M}$$

where V is the volume of the chamber, and M is the total weight of the actuator. Work can be estimated by the area of the force-displacement curve of the SMA diaphragm. Input power will be the input electrical power which can be calculated for the area of the voltage-current curve of the actuator. For composite diaphragm actuator 220 including composite diaphragm 200 (using the 0.3 mm NiTi plate), ED is 30 KJ/m$^3$, PD is 6000 KW/m$^3$ and SE is 12%/Kg. If a larger diaphragm stroke (and corresponding greater jet velocity) can be obtained due to increased phase transformation, both ED and PD will increase. The higher the frequency response of the material, the larger will be the PD.

Several units of composite diaphragm actuator 220 can be connected in series to achieve a synthetic jet actuator package, as generally indicated in FIG. 4C. An actuator package including four hybrid magnetic triggers 208 and three composite diaphragms 200 will have an overall size of about 72 mm×85.6 mm×300 mm, with a weight of about 3 Kg. Such a package can be readily integrated into an aircraft wing.

Although the present invention has been described in connection with the preferred form of practicing it and modifications thereto, those of ordinary skill in the art will understand that many other modifications can be made to the present invention within the scope of the claims that follow. Accordingly, it is not intended that the scope of the invention in any way be limited by the above description, but instead be determined entirely by reference to the claims that follow.

The invention claimed is:

1. A membrane actuator, comprising:
   (a) a membrane configured to be magnetically actuated, actuation of the membrane causing the membrane to move from a first position to a second position, the membrane comprising a shape memory alloy;
   (b) a magnetic trigger configured to selectively actuate the membrane; and
   (c) an additional membrane disposed such that the membrane and the additional membrane can be actuated by the magnetic trigger.

2. The membrane actuator of claim 1, wherein the magnetic trigger produces a magnetic field strength sufficient to induce a stress induced martensitic transformation in the shape memory alloy when the membrane is actuated.

3. The membrane actuator of claim 1, wherein the shape memory alloy comprises a ferromagnetic shape memory alloy.

4. The membrane actuator of claim 1, wherein the shape memory alloy is super elastic.

5. The membrane actuator of claim 1, wherein the membrane further comprises a ferromagnetic mass coupled with the shape memory alloy such that the ferromagnetic mass and the shape memory alloy move together, the ferromagnetic mass being configured to be attracted to the magnetic trigger when the magnetic trigger is activated.

6. A membrane actuator, comprising:
   (a) a membrane configured to be magnetically actuated, actuation of the membrane causing the membrane to move from a first position to a second position, the membrane comprising a shape memory alloy, wherein the membrane further comprises:
      (i) a ferromagnetic mass coupled with the shape memory alloy such that the ferromagnetic mass and the shape memory alloy move together, the ferromagnetic mass being configured to be attracted to the magnetic trigger when the magnetic trigger is activated; and
      (ii) at least one spacer disposed between the ferromagnetic mass and the shape memory alloy; and
   (b) a magnetic trigger configured to selectively actuate the membrane.

7. The membrane actuator of claim 6, wherein the at least one spacer is configured to enhance a rigidity of the membrane.

8. The membrane actuator of claim 6, wherein the at least one spacer is configured to prevent the ferromagnetic mass and the shape memory alloy from contacting during actuation.

9. A membrane actuator, comprising:
   (a) a magnetic trigger; and
   (b) a membrane configured to be magnetically actuated by the magnetic trigger, actuation of the membrane causing the membrane to move from a first position to a second position, the membrane comprising a shape memory alloy and an iron mass coupled with the shape memory alloy such that the iron mass and the shape memory alloy move together, the iron mass being configured to be attracted to the magnetic trigger when the magnetic trigger is activated.

10. The membrane actuator of claim 9, wherein the shape memory alloy comprises super elastic nickel titanium (NiTi) alloy.

11. A membrane actuator, comprising:
   (a) a magnetic trigger;
   (b) a membrane configured to be magnetically actuated by the magnetic trigger, actuation of the membrane causing the membrane to move from a first position to a second position, the membrane comprising a shape memory alloy and a first ferromagnetic mass coupled with the shape memory alloy such that the first ferromagnetic mass and the shape memory alloy move together, the first ferromagnetic mass being configured to be attracted to the magnetic trigger when the magnetic trigger is activated;

(c) an additional magnetic trigger; and
(d) an additional ferromagnetic mass coupled with the shape memory alloy such that the additional ferromagnetic mass and the shape memory alloy move together, the additional ferromagnetic mass being configured to be attracted to the additional magnetic trigger when the additional magnetic trigger is activated, a synchronized activation of the magnetic trigger and the additional magnetic trigger resulting in the membrane reciprocating back-and-forth between the magnetic trigger and the additional magnetic trigger.

12. A membrane actuator, comprising:
(a) a membrane configured to be magnetically actuated, actuation of the membrane causing the membrane to move from a first position to a second position, the membrane comprising a shape memory alloy; and
(b) a hybrid magnetic trigger including at least one permanent magnet and at least one electromagnet, the hybrid magnetic trigger being configured to selectively actuate the membrane, the hybrid magnetic trigger comprising at least one configuration selected from the group consisting essentially of:
  (i) a first configuration wherein each at least one permanent magnet comprises a ring magnet having a north pole, a south pole, an inner surface, and an outer surface, the north pole corresponding to one of the inner surface and the outer surface, the south pole corresponding to the other of the inner surface and the outer surface;
  (ii) a second configuration wherein each at least one permanent magnet comprises a ring magnet having a north pole, a south pole, an upper surface, and a lower surface, the north pole corresponding to one of the upper surface and the lower surface, the south pole corresponding to the other of the upper surface and the lower surface; and
  (iii) a third configuration wherein the hybrid magnetic trigger comprises a laminated yoke configured to reduce eddy currents in the hybrid magnetic trigger.

13. A membrane actuator, comprising:
(a) a membrane configured to be magnetically actuated, actuation of the membrane causing the membrane to move from a first position to a second position, the membrane comprising a shape memory alloy;
(b) a magnetic trigger; and
(c) wherein the membrane actuator is incorporated into a suspension system, the magnetic trigger being controllably coupled to a processor programmed and configured to actuate the membrane to dampen a vibration.

14. A membrane actuator, comprising:
(a) a membrane configured to be magnetically actuated, actuation of the membrane causing the membrane to move from a first position to a second position, the membrane comprising a shape memory alloy;
(b) a magnetic trigger configured to selectively actuate the membrane; and
(c) a housing, the membrane being disposed in the housing, such that an operating volume is defined by the membrane and the housing, wherein a movement of the membrane from the first position to the second position changes the operating volume and moves a fluid.

15. The membrane actuator of claim 14, wherein the housing comprises an orifice, the orifice coupling the operating volume in fluid communication with a source volume, the source volume being external to the housing.

16. The membrane actuator of claim 15, wherein the source volume comprises an ambient environment and when movement of the membrane results in an increase in the operating volume, a fluid in the ambient environment is drawn into the operating volume, and when movement of the membrane results in a decrease in the operating volume, a fluid in the operating volume is emitted from the orifice into the ambient environment.

17. The membrane actuator of claim 16, wherein repeated actuation of the membrane forms a series of fluid vortices that are projected into the ambient environment via the orifice, the fluid vortices entraining a portion of the fluid in the ambient environment, thereby generating a synthetic jet.

18. The membrane actuator of claim 17, wherein the membrane actuator is incorporated into a wing of an aircraft, and disposed such that the synthetic jet is directed into a flow of air moving over the wing.

19. The membrane actuator of claim 14, wherein the housing comprises a fluid inlet configured to be placed in fluid communication with a fluid supply, and a fluid outlet configured to be placed in fluid communication with a discharge volume, repeated actuation of the membrane resulting in movement of fluid from the fluid supply, through the housing, and into the discharge volume.

20. The membrane actuator of claim 19, further comprising a first valve and a second valve, the first valve being configured to isolate the operating volume from the fluid supply when movement of the membrane results in a decrease in the operating volume, and the second valve being configured to isolate the operating volume from the discharge volume when movement of the membrane results in an increase in the operating volume.

* * * * *

UNITED STATES PATENT AND TRADEMARK OFFICE
CERTIFICATE OF CORRECTION

| | | |
|---|---|---|
| PATENT NO. | : 7,280,016 B2 | |
| APPLICATION NO. | : 11/070385 | |
| DATED | : October 9, 2007 | |
| INVENTOR(S) | : Taya et al. | |

It is certified that error appears in the above-identified patent and that said Letters Patent is hereby corrected as shown below:

| | |
|---|---|
| Column 1, line 22 | "The invention was funded at least in part with DARPA Grant No. N00014-02-1-0689, and the U.S. government may have certain rights in this invention." should read --This invention was made with U.S. government support under grant number N00014-02-1-0689 awarded by the Department of Defense, Department of the Navy. The U.S. government has certain rights in the invention.-- |
| Column 3, line 7 | "a" should read --an-- |
| Column 3, line 10 | After "actuated" delete "the" |
| Column 6, line 14 | "it" should read --is-- |
| Column 15, line 52 | "become" should read --becomes-- |
| Column 16, line 6 | "particular" should read --particularly-- |
| Column 17, line 8 | After "shown" insert therefor --in-- |
| Column 23, line 29 | "coil" should read --coils-- |

UNITED STATES PATENT AND TRADEMARK OFFICE
CERTIFICATE OF CORRECTION

PATENT NO. : 7,280,016 B2
APPLICATION NO. : 11/070385
DATED : October 9, 2007
INVENTOR(S) : Taya et al.

It is certified that error appears in the above-identified patent and that said Letters Patent is hereby corrected as shown below:

Column 25, line 14              "in" should read --is--

Signed and Sealed this

Twenty Second Day of April, 2008

JON W. DUDAS
*Director of the United States Patent and Trademark Office*